(12) United States Patent
Bak et al.

(10) Patent No.: US 12,720,753 B2
(45) Date of Patent: Aug. 25, 2026

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Jumi Bak, Suwon-si (KR); Eun-Young Lee, Suwon-si (KR); Sunggil Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 18/462,390

(22) Filed: Sep. 6, 2023

(65) Prior Publication Data

US 2024/0224532 A1 Jul. 4, 2024

(30) Foreign Application Priority Data

Dec. 29, 2022 (KR) ........................ 10-2022-0189553

(51) Int. Cl.
*H10B 43/40* (2023.01)
*G11C 16/04* (2006.01)
(Continued)

(52) U.S. Cl.
CPC ......... *H10B 43/40* (2023.02); *G11C 16/0483* (2013.01); *H10B 41/10* (2023.02);
(Continued)

(58) Field of Classification Search
CPC ........ H10B 43/40; H10B 41/10; H10B 41/27; H10B 41/35; H10B 41/41; H10B 43/10;
(Continued)

(56) References Cited

U.S. PATENT DOCUMENTS 6,636,588 B2 10/2003 Hawryluk et al.
6,916,690 B2 7/2005 Chang
(Continued)

FOREIGN PATENT DOCUMENTS

KR 10-2021-0057265 5/2021

OTHER PUBLICATIONS

Santhanakrishnan. T., Rajesh, R., Awasthi, R.L et al., Optical diffraction phenomena around the edges of photodetectors: A simplified method for metrological applications, Sci Rep 9, 3397 (2019).

*Primary Examiner* — S M Sohel Imtiaz
(74) *Attorney, Agent, or Firm* — Morgan, Lewis & Bockius LLP

(57) ABSTRACT

A semiconductor device includes a semiconductor substrate, a peripheral circuit structure including peripheral circuits integrated on the semiconductor substrate and first bonding pads connected to the peripheral circuits, and a cell array structure including second bonding pads bonded to the first bonding pads. The cell array structure includes separation structures extending in a first direction, a stack disposed between the separation structures, a source conductive pattern disposed on the stack, vertical structures penetrating the stack and connected to the source conductive pattern, and reflection structures, which are vertically spaced apart from the source conductive pattern and are overlapped with the separation structures. The stack includes interlayer insulating layers and gate patterns, which are vertically and alternately stacked on top of one another.

10 Claims, 21 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 41/41*** | (2023.01) |
| ***H10B 43/10*** | (2023.01) |
| ***H10B 43/27*** | (2023.01) |
| ***H10B 43/35*** | (2023.01) |
| ***H10B 80/00*** | (2023.01) |
| ***H10W 90/00*** | (2026.01) |

(52) U.S. Cl.
CPC ............. *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 80/00* (2023.02); *H10W 90/00* (2026.01); *H10W 90/752* (2026.01)

(58) Field of Classification Search
CPC ........ H10B 43/27; H10B 43/35; H10B 80/00; G11C 16/0483; H10W 90/00; H10W 90/752
See application file for complete search history.

(56) References Cited

U.S. PATENT DOCUMENTS

| | | | | |
|---|---|---|---|---|
| 8,158,486 | B2 | 4/2012 | Van Bentum et al. | |
| 8,278,690 | B2 | 10/2012 | Mae et al. | |
| 8,441,850 | B2 | 5/2013 | Lee et al. | |
| 8,921,220 | B2 | 12/2014 | Wenxu et al. | |
| 9,349,870 | B2 | 5/2016 | Wang et al. | |
| 9,391,086 | B1 | 7/2016 | Soda et al. | |
| 10,978,428 | B2 | 4/2021 | Kim | |
| 11,011,209 | B2 | 5/2021 | Kim et al. | |
| 11,127,728 | B2 | 9/2021 | Zhou et al. | |
| 2013/0334593 | A1* | 12/2013 | Seol | H10D 30/697 257/324 |
| 2016/0043100 | A1* | 2/2016 | Lee | H10B 43/10 257/324 |
| 2016/0111441 | A1* | 4/2016 | Park | H10B 43/10 438/268 |
| 2017/0200736 | A1* | 7/2017 | Park | H10B 43/27 |
| 2020/0243498 | A1* | 7/2020 | Zhang | H10W 42/60 |
| 2020/0243500 | A1* | 7/2020 | Zhou | H10W 90/00 |
| 2021/0138581 | A1 | 5/2021 | Cho et al. | |
| 2021/0320119 | A1 | 10/2021 | Zhang et al. | |
| 2022/0005825 | A1 | 1/2022 | Zhang | |
| 2022/0052062 | A1 | 2/2022 | Zhang | |
| 2022/0068903 | A1* | 3/2022 | Kim | H10B 43/40 |
| 2022/0085061 | A1 | 3/2022 | Yamasaka | |
| 2023/0128492 | A1 | 4/2023 | Cho et al. | |
| 2023/0157187 | A1* | 5/2023 | Chiang | H10B 63/80 257/4 |
| 2023/0209821 | A1* | 6/2023 | Ishida | H10D 30/603 257/314 |
| 2023/0247823 | A1 | 8/2023 | Cho et al. | |
| 2023/0301077 | A1* | 9/2023 | Rajashekhar | H10B 41/40 257/314 |
| 2024/0090217 | A1* | 3/2024 | Nabesaka | H10B 43/20 |

* cited by examiner 2210
2400
2100
2130
2500
2003
I
I'
3210
3220
2200
2300
2003a
2003b
2003
2005
2001
2002
2004
2006
2000

100
CPLG
VS2
SS3
SS3
SS3
IOPLG
CPLG
VS2
B'
SS3
SS3
A
A'
B
VS1
SS1
VS1
SS2
VS1
SS1
VS1
ST
CNR2
CNR1
CAR
D1
D2
D3

CS
PS
CNR2
CNR1
CAR
CST
301
303
340
330
320
PAD
310
CP
110a
110b
IOPLG
PPLG
120
140
150
LCLb
160
170
BP1
340
VA
OP
CPLG
UCLb
LCLa
BP2
PLP
PTR
PCP
ILD1
GE1
ILD2
GE2
BCTa
BCTb
BL
UCLa
220
210
200
201
ST1
ST2
ST
B
B'

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2022-0189553, filed on Dec. 29, 2022, in the Korean Intellectual Property Office, the entire contents of which are hereby incorporated by reference.

TECHNICAL FIELD

The present disclosure relates to semiconductors and, more specifically, to a semiconductor device and an electronic system including the same.

DISCUSSION OF THE RELATED ART

A semiconductor device capable of storing a large capacity of data is a desirable element of an electronic system. Accordingly, many studies are being conducted to increase the data storage capacity of the semiconductor device. For example, semiconductor devices, in which memory cells are three-dimensionally arranged, are being suggested.

SUMMARY

A semiconductor device includes a semiconductor substrate, a peripheral circuit structure including peripheral circuits integrated on the semiconductor substrate and first bonding pads connected to the peripheral circuits, and a cell array structure including second bonding pads bonded to the first bonding pads. The cell array structure includes separation structures extending in a first direction. A stack is disposed between the separation structures. The stack includes interlayer insulating layer and gate patterns, which are vertically and alternately stacked on top of one another. A source conductive pattern is disposed on the stack and electrically connected to the source conductive pattern. Reflection structures are vertically spaced apart from the source conductive pattern and are overlapped with the separation structures.

A semiconductor device includes a semiconductor substrate, a peripheral circuit structure including peripheral circuits integrated on the semiconductor substrate and first bonding pads connected to the peripheral circuits, and a cell array structure including second bonding pads bonded to the first bonding pads. The cell array structure includes separation structures extending in a first direction, a stack disposed between the separation structures, the stack including interlayer insulating layers and gate patterns which are vertically and alternately stacked on top of one another, a source conductive pattern disposed on the stack, and vertical structures penetrating the stack and connected to the source conductive pattern. Each of the separation structures includes an absorption pattern, which is extended in the first direction, and a separation insulating pattern, which is disposed between the absorption pattern and the stack and between the absorption pattern and the source conductive pattern.

An electronic system includes a semiconductor device including a peripheral circuit structure and a cell array structure disposed on the peripheral circuit structure, and a controller, which is electrically connected to the semiconductor device through an input/output pad and is configured to control the semiconductor device. The peripheral circuit structure includes peripheral circuits, which are integrated on a semiconductor substrate, and first bonding pads, which are connected to the peripheral circuits. The cell array structure includes second bonding pads, which are bonded to the first bonding pads. The cell array structure includes separation structures extending in a first direction, a stack disposed between the separation structures, the stack including interlayer insulating layers and gate patterns, which are vertically and alternately stacked on top of one another, a source conductive pattern disposed on the stack, vertical structures penetrating the stack and connected to the source conductive pattern, and reflection structures, which are vertically spaced apart from the source conductive pattern and are overlapped with the separation structures.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 5 is a plan view illustrating a semiconductor device according to an embodiment of the inventive concept;

DETAILED DESCRIPTION

Figure 1:
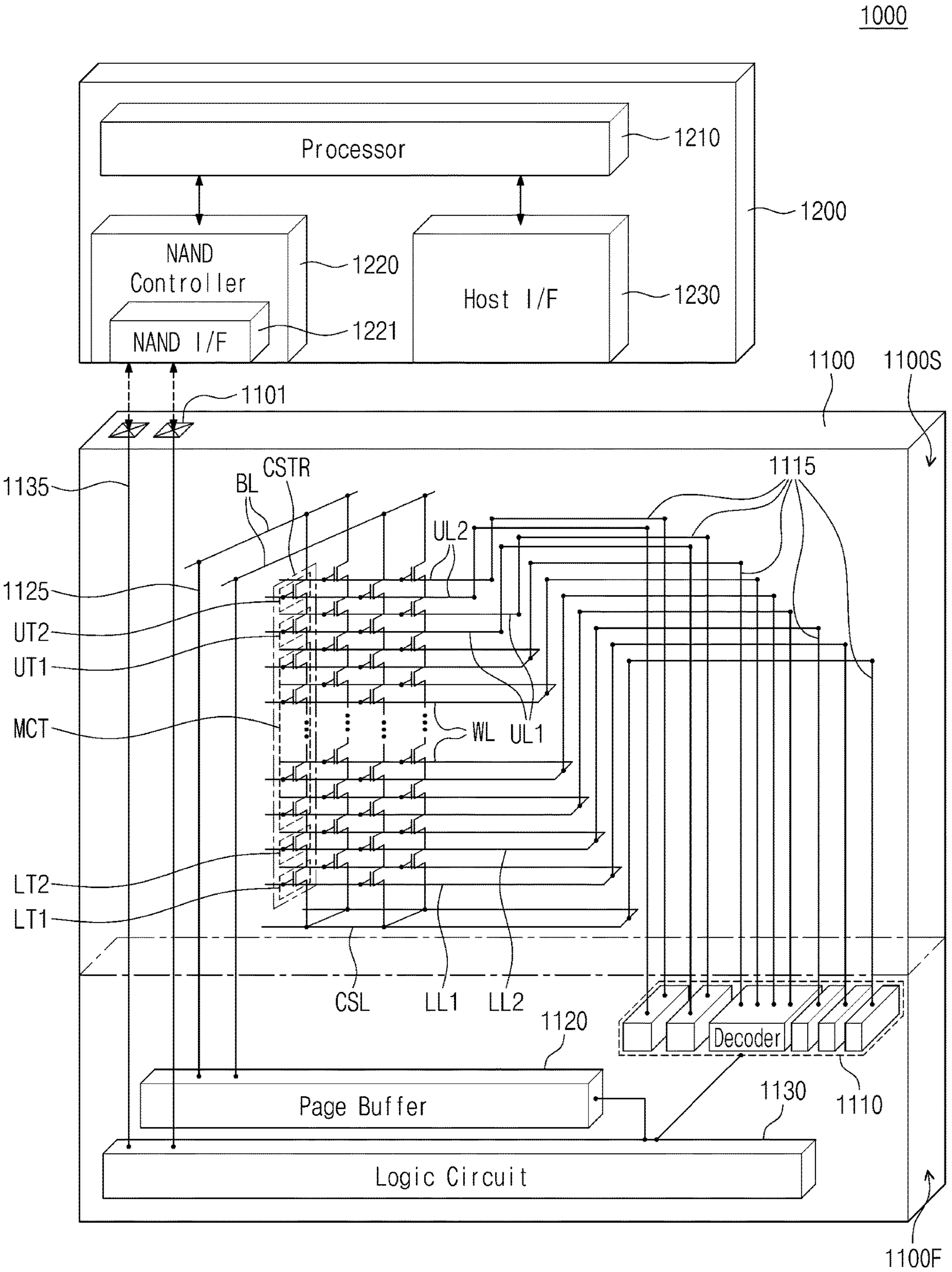
FIG. 1 is a diagram schematically illustrating an electronic system including a semiconductor device according to an embodiment of the inventive concept.

Example embodiments of the inventive concepts will now be described more fully with reference to the accompanying drawings, in which example embodiments are shown. Like reference numerals in the drawings denote like elements. To the extent that a detailed description of an element has been omitted, it is to be assumed that the element is at least similar to corresponding elements that have been described elsewhere within the specification.

FIG. 1 is a diagram schematically illustrating an electronic system including a semiconductor device according to an embodiment of the inventive concept.

Referring to FIG. 1, an electronic system 1000, according to an embodiment of the inventive concept, may include a semiconductor device 1100 and a controller 1200, which is electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S disposed on the first structure 1100F. In an embodiment, the first structure 1100F may be disposed near the second structure 1100S.

The first structure 1100F may be a peripheral circuit structure, which includes a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, the upper transistors UT1 and UT2 may include at least one string selection transistor, and the lower transistors LT1 and LT2 may include at least one ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. The lower and/or upper erase control transistors LT1 and UT2 may be used to perform an erase operation of erasing data in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F to the second structure 1100S. The bit lines BL may be electrically connected to the page buffer 1120 through second connection lines 1125, which are extended from the first structure 1100F to the second structure 1100S.

In the first structure 1100F, the decoder circuit 1110 and the page buffer 1120 may be configured to perform a control operation on at least one transistor that is selected from the memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135, which is provided in the first structure 1100F and is extended into the second structure 1100S.

The first structure 1100F may include a voltage generator. The voltage generator may generate a program voltage, a read voltage, a pass voltage, a verification voltage, and so forth, which are used to operate the memory cell strings CSTR. Here, the program voltage may be a relatively high voltage (e.g., 20V to 40V), compared with the read voltage, the pass voltage, and the verification voltage.

In an embodiment, the first structure 1100F may include high voltage transistors and low voltage transistors. The decoder circuit 1110 may include pass transistors which are connected to the word lines WL of the memory cell strings CSTR. The pass transistors may include high-voltage transistors which can stand a high voltage (e.g., the program voltage) applied to the word lines WL during a programming operation). The page buffer 1120 may also include high-voltage transistors which can stand the high voltage.

The controller 1200 may include a processor 1210, a NAND controller 1220, and a host interface 1230. In an embodiment, the electronic system 1000 may include a plurality of semiconductor devices 1100, and in this case, the controller 1200 may control the semiconductor devices 1100.

The processor 1210 may control overall operations of the electronic system 1000 including the controller 1200. The processor 1210 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be used to transmit and receive control commands for controlling the semiconductor device 1100 and data to be written in or read from the memory cell transistors MCT of the semiconductor device 1100. The host interface 1230 may be configured to allow for communication between the electronic system 1000 and an external host. When a control command is received from an external host through the host interface 1230, the processor 1210 may control the semiconductor device 1100 in response to the control command.

Figure 2:
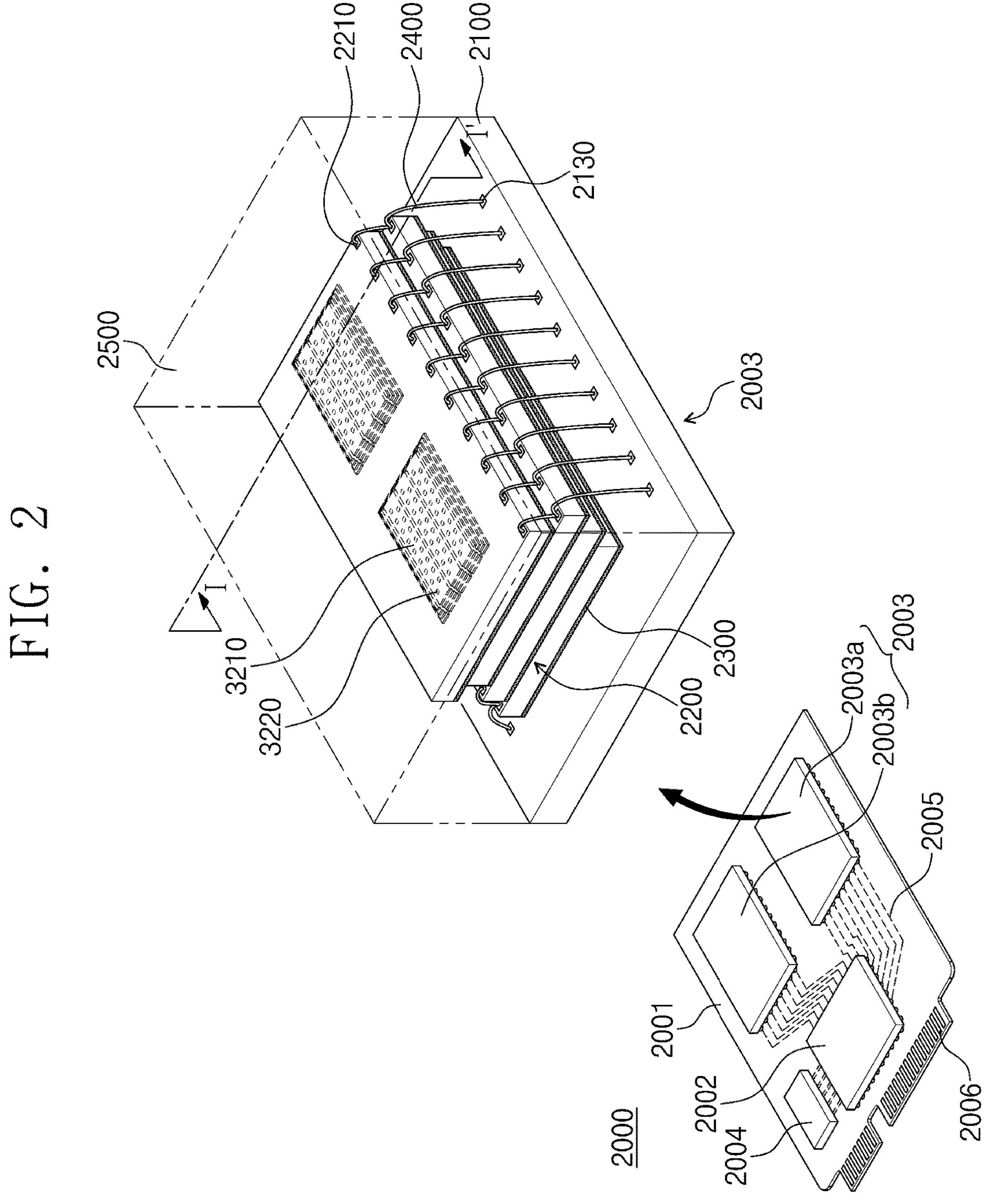
FIG. 2 is a perspective view schematically illustrating an electronic system including a semiconductor device according to an embodiment of the inventive concept.

FIG. 2 is a perspective view schematically illustrating an electronic system including a semiconductor device according to an embodiment of the inventive concept.

Referring to FIG. 2, an electronic system 2000, according to an embodiment of the inventive concept, may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 through interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In an embodiment, the electronic system

2000 may be driven by power, which is supplied from the external host through the connector 2006. The electronic system 2000 may further include a power management integrated circuit (PMIC) that is configured to separately supply an electric power, which is supplied from the external host, to the controller 2002 and the semiconductor package 2003.

The controller 2002 may be configured to control a writing or reading operation on the semiconductor package 2003 and to increase an operation speed of the electronic system 2000.

The DRAM 2004 may be a buffer memory that is configured to relieve technical difficulties caused by a difference in speed between the semiconductor package 2003, which serves as a data storage device, and an external host. In an embodiment, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 disposed on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 and covering the semiconductor chips 2200 and the connection structure 2400.

The package substrate 2100 may be a printed circuit board including upper pads 2130. Each of the semiconductor chips 2200 may include an input/output pad 2210. The input/output pad 2210 may correspond to the input/output pad 1101 of FIG. 1. Each of the semiconductor chips 2200 may include stacks 3210 and vertical structures 3220. Each of the semiconductor chips 2200 may include a semiconductor device, which will be described below, according to an embodiment of the inventive concept.

In an embodiment, the connection structure 2400 may include a bonding wire electrically connecting the input/output pad 2210 to the upper pads 2130. Thus, in each of the first and second semiconductor packages 2003*a* and 2003*b*, the semiconductor chips 2200 may be electrically connected to each other in a bonding wire manner and may be electrically connected to the upper pads 2130 of the package substrate 2100. In an embodiment, the semiconductor chips 2200 in each of the first and second semiconductor packages 2003*a* and 2003*b* may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, which is prepared regardless of the main substrate 2001, and may be connected to each other through interconnection lines, which are provided in the interposer substrate.

Figure 3:
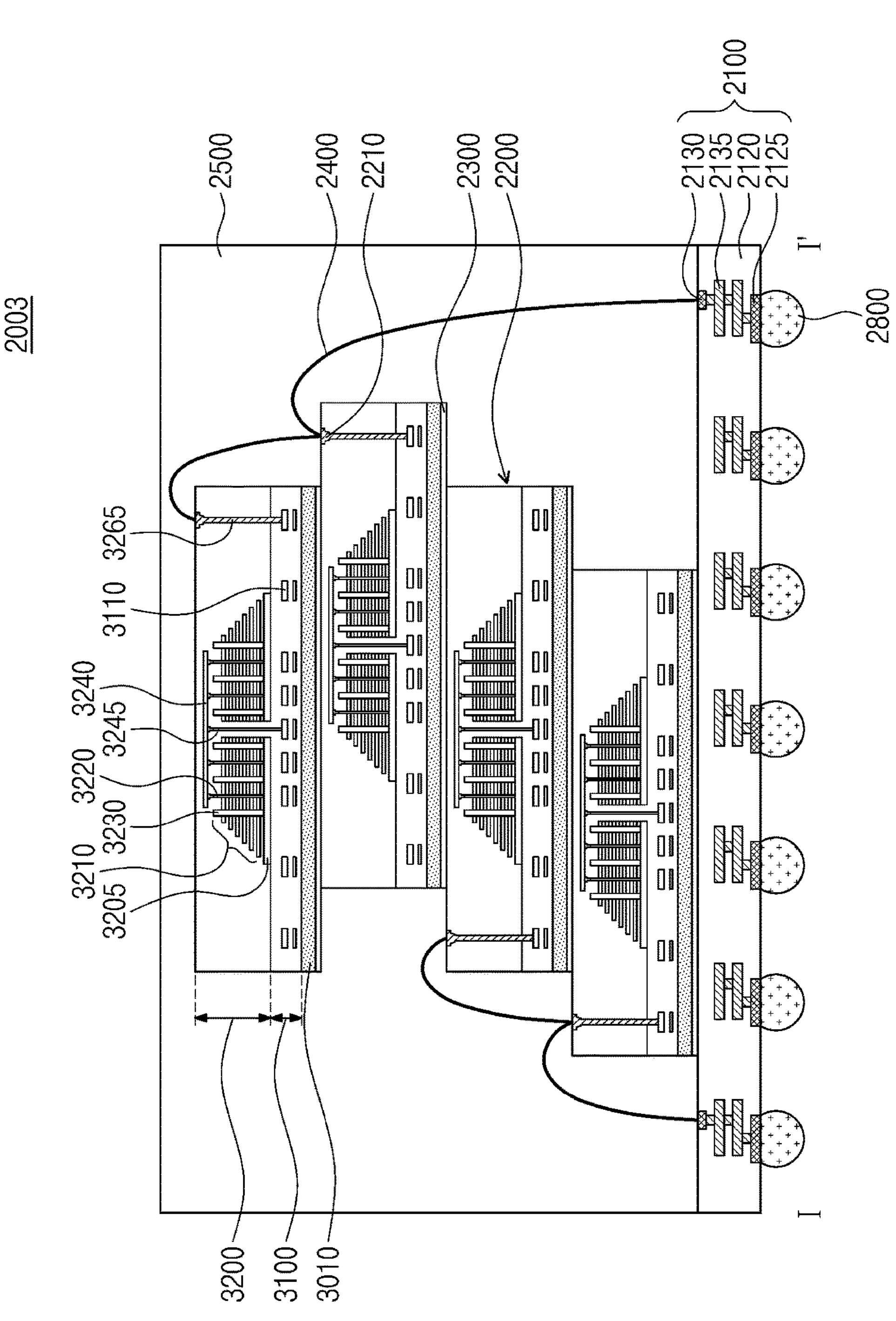
FIGS. 3 and 4 are cross-sectional views schematically illustrating semiconductor packages according to an embodiment of the inventive concept.
Figure 4:
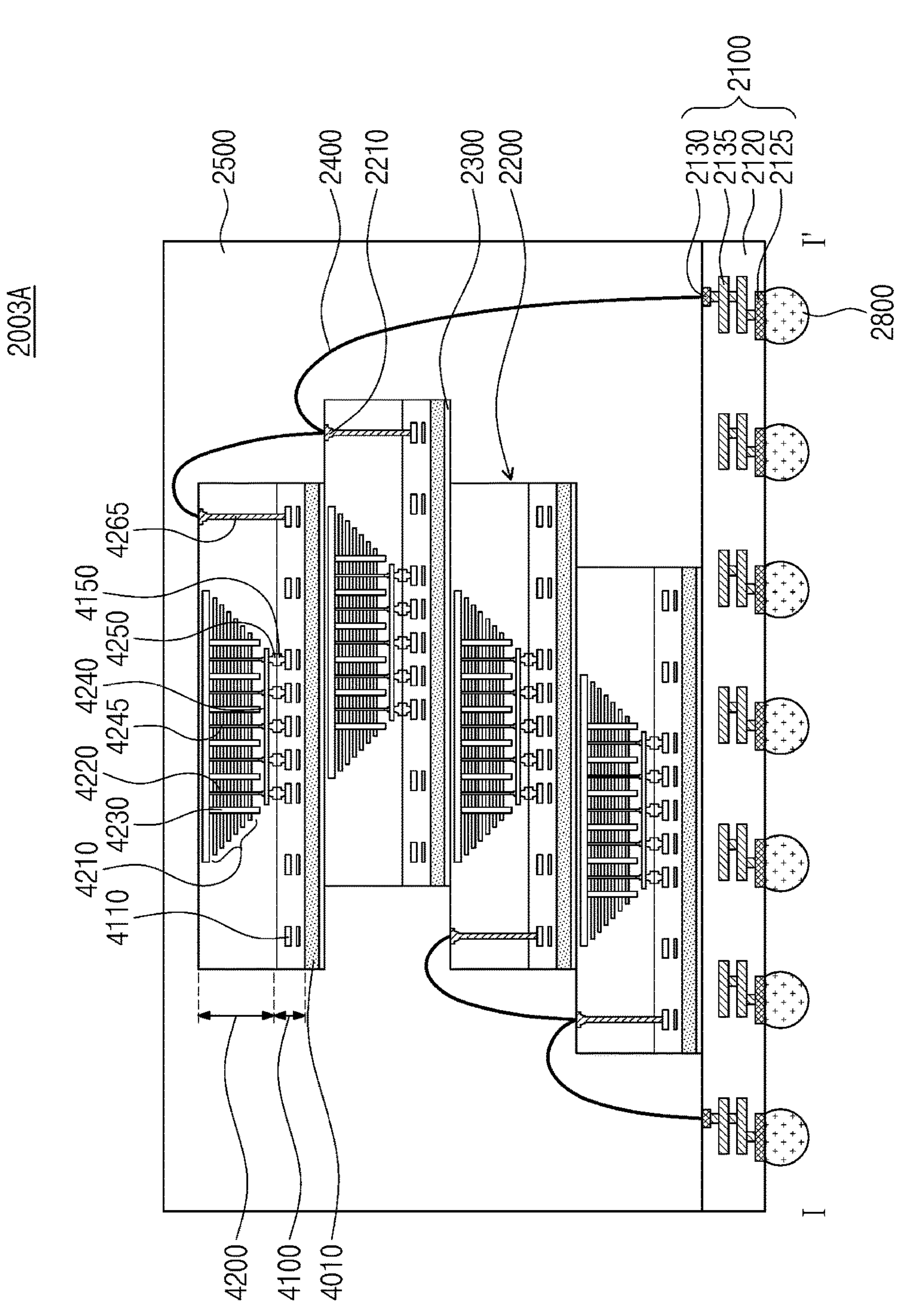

FIGS. 3 and 4 are cross-sectional views schematically illustrating semiconductor packages according to an embodiment of the inventive concept. FIGS. 3 and 4 are cross-sectional views, which are taken along a line I-I' of FIG. 2 to illustrate two different examples of the semiconductor package of FIG. 2.

Referring to FIG. 3, in the semiconductor package 2003, the package substrate 2100 may be a printed circuit board. The package substrate 2100 may include a package substrate body portion 2120, the upper pads 2130 (e.g., of FIG. 2), which are disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, a stack 3210 on the source structure 3205, the vertical structures 3220 and separation structures penetrating the stack 3210, bit lines 3240 electrically connected to the vertical structures 3220, and cell contact plugs electrically connected to the word lines WL (e.g., of FIG. 1) of the stack 3210. Each of the first and second structures 3100 and 3200 and the semiconductor chips 2200 may further include separation structures to be described below.

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210, and in an embodiment, the penetration line 3245 may further penetrate the stack 3210. Each of the semiconductor chips 2200 may further include the input/output pads 2210 (e.g., of FIG. 2), which are electrically connected to the peripheral lines 3110 of the first structure 3100.

Referring to FIG. 4, in a semiconductor package 2003A, each of the semiconductor chips 2200 may include a semiconductor substrate 4010, a first structure 4100 disposed on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the first structure 4100 and the source structure 4205, vertical structures 4220 and a separation structure penetrating the stack 4210, and second junction structures 4250, which are electrically and respectively connected to the vertical structures 4220 and the word lines WL (e.g., see FIG. 1) of the stack 4210. For example, the second junction structures 4250 may be electrically and respectively connected to the vertical structures 4220 and the word lines WL (e.g., of FIG. 1) through bit lines 4240, which are electrically connected to the vertical structures 4220, and cell contact plugs, which are electrically connected to the word lines WL (e.g., of FIG. 1). The first junction structures 4150 of the first structure 4100 may be in contact with and bonded to the second junction structures 4250 of the second structure 4200. The bonded portions of the first and second junction structures 4150 and 4250 may be formed of or may include, for example, copper (Cu).

Each of the first and second structures 4100 and 4200 and the semiconductor chips 2200 may further include a source structure in an embodiment to be described below. Each of the semiconductor chips 2200 may further include the input/output pads 2210 (e.g., of FIG. 2), which are electrically connected to the peripheral lines 4110 of the first structure 4100.

The semiconductor chips 2200 of FIG. 3 or 4 may be electrically connected to each other by the connection structures 2400, which are provided in the form of bonding wires. However, in an embodiment, semiconductor chips, which are provided in the same semiconductor package as the semiconductor chips 2200 of FIG. 3 or 4, may be electrically connected to each other by a connection structure including through silicon vias (TSVs).

The first structure 3100 or 410 of FIG. 3 or 4 may correspond to a peripheral circuit structure in an embodiment to be described below, and the second structure 3200 or 420 of FIG. 3 or 4 may correspond to a cell array structure in an embodiment to be described below.

Figure 5:
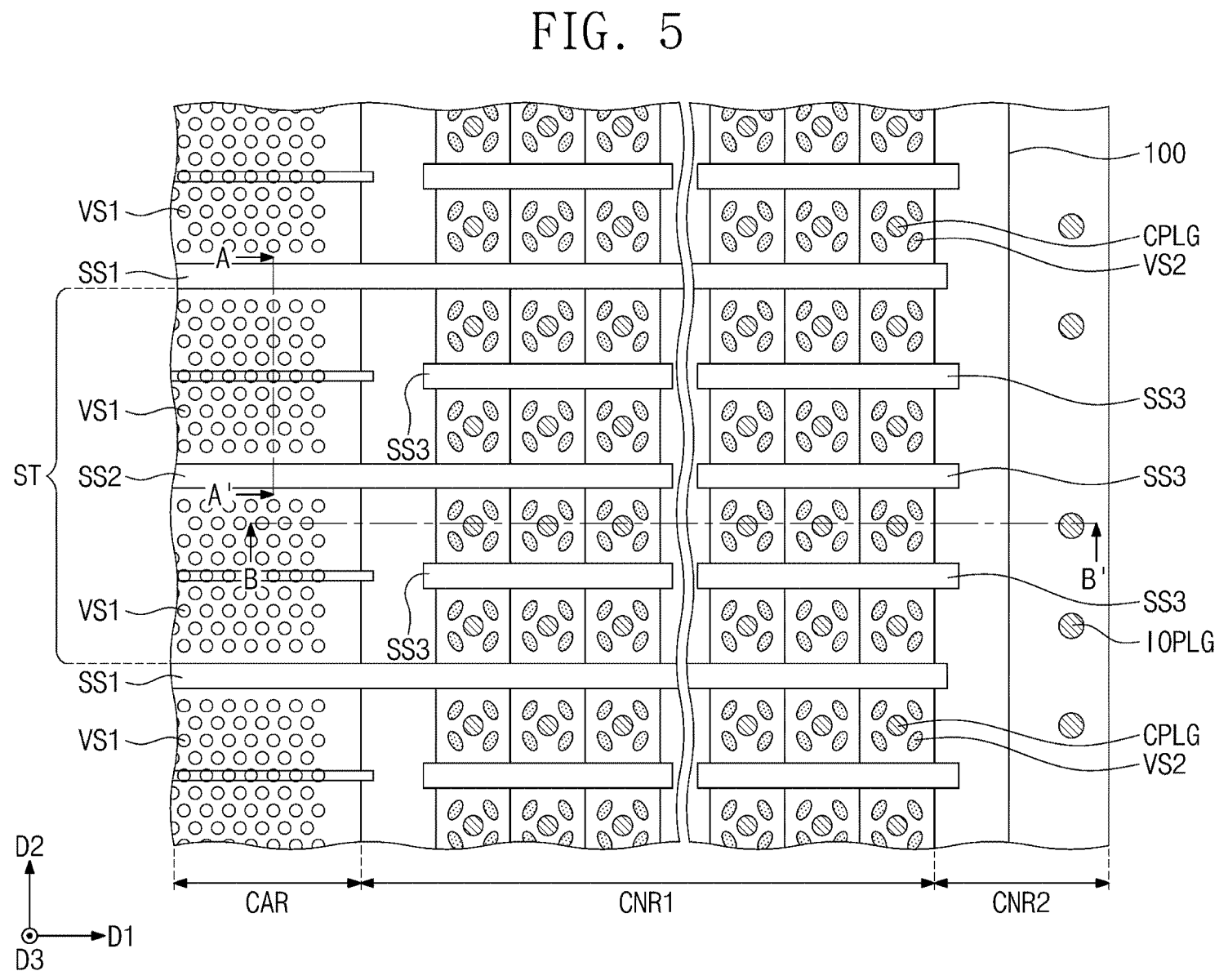
Figure 6A:
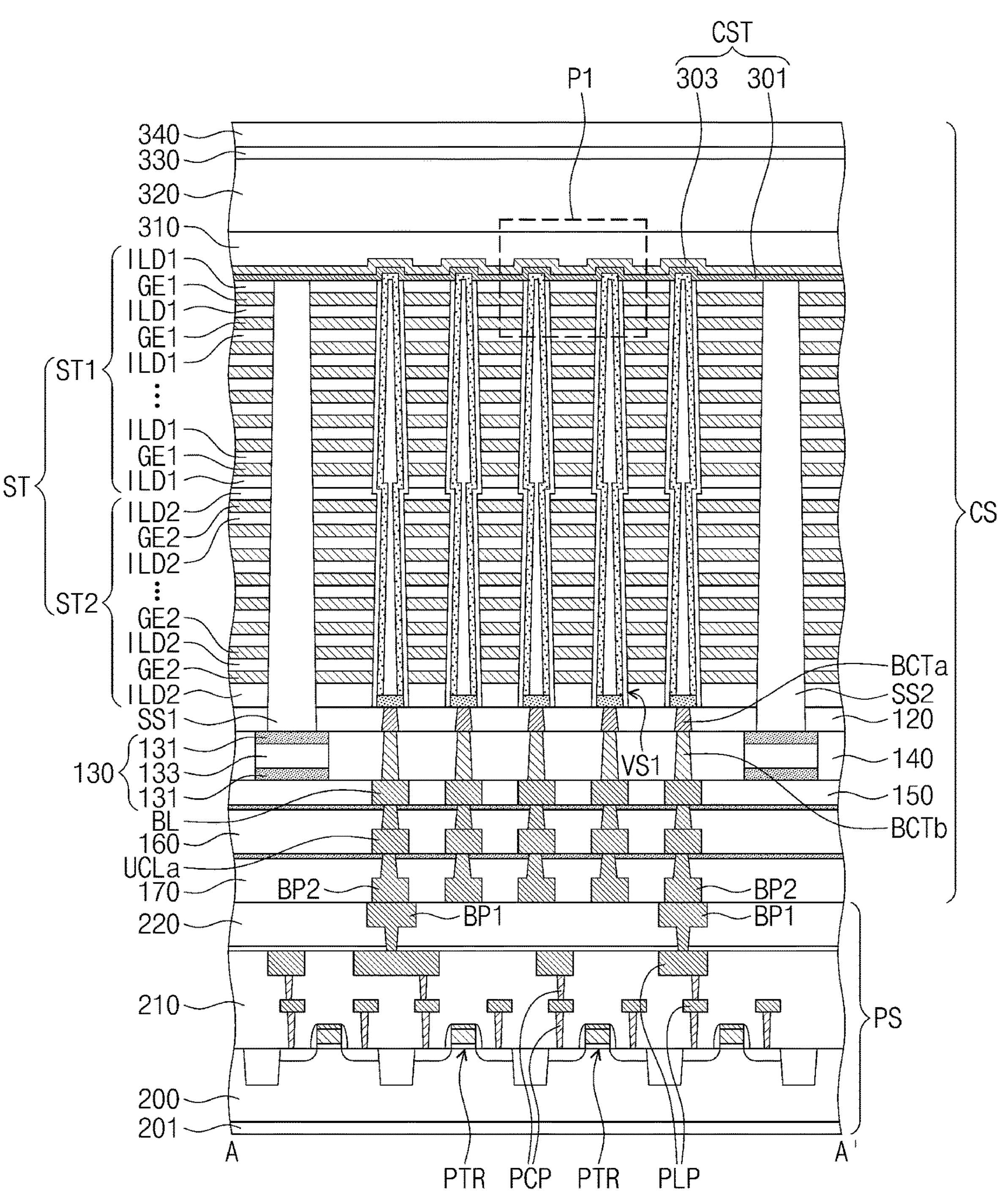
FIG. 6A is a cross-sectional view, which is taken along a line A-A' of FIG. 5 to illustrate a semiconductor device according to an embodiment of the inventive concept.
Figure 6B:
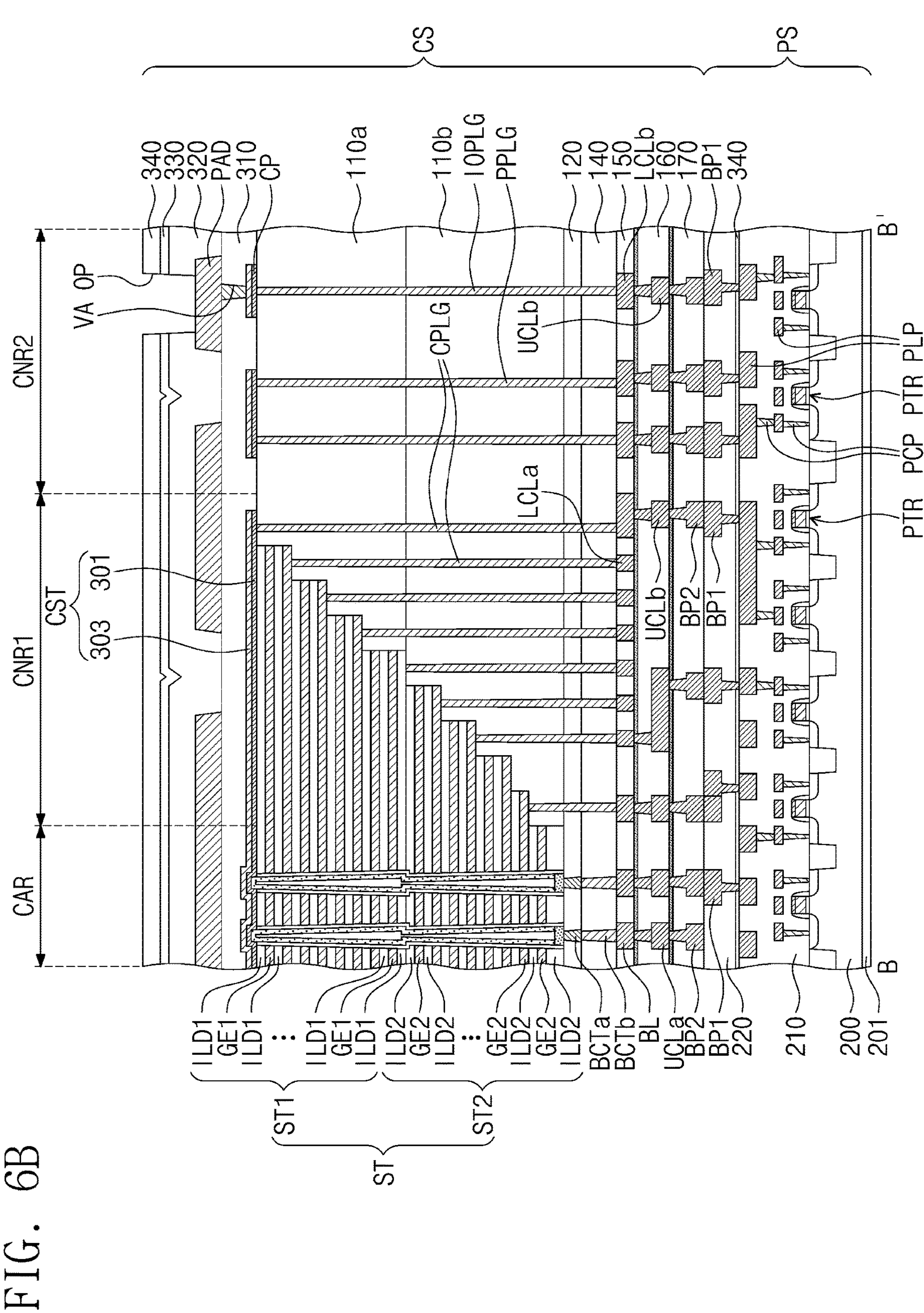
FIG. 6B is a cross-sectional view, which is taken along a line B-B' of FIG. 5 to illustrate a semiconductor device according to an embodiment of the inventive concept.

FIG. 5 is a plan view illustrating a semiconductor device according to an embodiment of the inventive concept. FIG. 6A is a cross-sectional view, which is taken along a line A-A' of FIG. 5 to illustrate a semiconductor device according to an embodiment of the inventive concept. FIG. 6B is a cross-sectional view, which is taken along a line B-B' of FIG. 5 to illustrate a semiconductor device according to an embodiment of the inventive concept.

Referring to FIGS. 5, 6A, and 6B, a semiconductor device, according to an embodiment of the inventive concept, may include a peripheral circuit structure PS disposed on a semiconductor substrate 200 and a cell array structure CS disposed on the peripheral circuit structure PS.

In an embodiment, since the cell array structure CS is placed on the peripheral circuit structure PS, a cell capacity per unit area in the semiconductor device may be increased. In addition, the peripheral circuit structure PS and the cell array structure CS may be separately fabricated and then may be coupled to each other, and in this case, it may be possible to prevent peripheral circuits PTR from being damaged by several thermal treatment processes. Accordingly, the semiconductor device may have increased electrical connectivity and reliability.

For example, the peripheral circuit structure PS may include the semiconductor substrate 200, the peripheral circuits PTR controlling a memory cell array, and peripheral interlayer insulating layers 210 and 220 covering the peripheral circuits PTR. The peripheral circuits PTR may be integrated on a top surface of the semiconductor substrate 200. A surface insulating layer 201 may be provided on a rear surface of the semiconductor substrate 200.

The semiconductor substrate 200 may be a silicon substrate, a silicon-germanium substrate, a germanium substrate, or a structure including a single-crystalline silicon substrate and a single crystalline epitaxial layer grown therefrom. The semiconductor substrate 200 may have a top surface that is parallel to two different directions (e.g., a first direction D1 and a second direction D2) and is perpendicular to a third direction D3. For example, the first to third directions D1, D2, and D3 may be orthogonal to each other.

The peripheral circuits PTR may include row and column decoders, a page buffer, a control circuit, and so forth. For example, the peripheral circuits PTR may include NMOS and PMOS transistors. Peripheral circuit lines PLP may be electrically connected to the peripheral circuits PTR through peripheral contact plugs PCP.

In an embodiment, widths of the peripheral contact plugs PCP in the first or second direction D1 or D2 may increase as a height in the third direction D3 increases. The peripheral contact plugs PCP and the peripheral circuit lines PLP may be formed of or may include one or more conductive materials (e.g., metallic materials).

The peripheral interlayer insulating layers 210 and 220 may be provided on the top surface of the semiconductor substrate 200. The peripheral interlayer insulating layers 210 and 220 on the semiconductor substrate 200 may cover the peripheral circuits PTR, the peripheral contact plugs PCP, and the peripheral circuit lines PLP. The peripheral contact plugs PCP and the peripheral circuit lines PLP may be electrically connected to the peripheral circuits PTR. Each of the peripheral interlayer insulating layers 210 and 220 may include a silicon oxide layer, a silicon nitride layer, a silicon oxynitride layer, and/or a low-k dielectric layer (where "low-k" is understood to be a material having a dielectric constant that is less than that of silicon oxide).

First bonding pads BP1 may be disposed in the uppermost one of the peripheral interlayer insulating layer 220. The peripheral interlayer insulating layer 220 might not cover top surfaces of the first bonding pads BP1. A top surface of the uppermost peripheral interlayer insulating layer 220 may be substantially coplanar with the top surfaces of the first bonding pads BP1. The first bonding pads BP1 may be electrically connected to the peripheral circuits PTR through the peripheral circuit lines PLP and the peripheral contact plugs PCP.

The cell array structure CS may be provided on the peripheral circuit structure PS. The cell array structure CS of the semiconductor device may include a cell array region CAR and first and second connection regions CNR1 and CNR2, and here, the first connection region CNR1 may be placed between the cell array region CAR and the second connection region CNR2 in the first direction D1.

The cell array structure CS may include a memory cell array, in which memory cells are three-dimensionally arranged. The cell array structure CS may include a source conductive pattern CST, a stack ST, first and second vertical structures VS1 and VS2, bit lines BL, cell contact plugs CPLG, peripheral contact plugs PPLG, and input/output contact plugs IOPLG.

The cell array structure CS may include a plurality of stacks ST. When viewed in the plan view of FIG. 5, the stacks ST may be extended in the first direction D1 and may be spaced apart from each other in the second direction D2. Hereinafter, just one stack ST will be described, for brevity's sake, but the others of the stacks ST may have substantially the same features as described below.

The stack ST may include conductive patterns GE1 and GE2 and interlayer insulating layers ILD1 and ILD2, which are alternately stacked in the third direction D3 (e.g., a vertical direction) that is perpendicular to the first and second directions D1 and D2.

In an embodiment, the conductive patterns GE1 and GE2 may include first and second erase gate patterns adjacent to the source conductive pattern CST, a ground selection gate pattern on the second erase gate pattern, a plurality of cell gate patterns stacked on the ground selection gate pattern, and a string selection gate pattern on the uppermost one of the cell gate patterns.

The conductive patterns GE1 and GE2 of the stack ST may be stacked to have an inverted staircase structure in the first connection region CNRL. For example, lengths of the conductive patterns GE1 and GE2 in the first direction D1 may increase as a distance from the peripheral circuit structure PS increases.

Each of the conductive patterns GE1 and GE2 may include a pad portion, which is provided in the first connection region CNR1. The pad portions of the conductive patterns GE1 and GE2 may be located at different positions in horizontal and vertical directions. The cell contact plugs CPLG may be respectively coupled to the pad portions of the conductive patterns GE1 and GE2.

In an embodiment, the stack ST may include a first stack ST1 and a second stack ST2 on the first stack ST1. The first stack ST1 may include first interlayer insulating layers ILD1 and first conductive patterns GE1, which are alternately stacked on top of one another, and the second stack ST2 may include second interlayer insulating layers ILD2 and second conductive patterns GE2, which are alternately stacked on top of one another.

The second stack ST2 may be disposed between the first stack ST1 and the peripheral circuit structure PS. For example, the second stack ST2 may be provided on a bottom surface of the bottommost one of the first interlayer insulating layers ILD1 of the first stack ST1. The topmost one of the second interlayer insulating layers ILD2 of the second stack ST2 may be in contact with the bottommost one of the first interlayer insulating layers ILD1 of the first stack ST1, but the inventive concept is not necessarily limited to this example. For example, a single insulating layer may be provided between the topmost one of the second conductive patterns GE2 of the second stack ST2 and the first conductive patterns GE1 of the first stack ST1.

The bottommost one of the second conductive patterns GE2 of the second stack ST2 may have the shortest length in the first direction D1, and the topmost one of the first conductive patterns GE1 of the first stack ST1 may have the longest length in the first direction D1.

In an embodiment, the first and second conductive patterns GE1 and GE2 may be formed of or may include doped semiconductor materials (e.g., doped silicon), metallic materials (e.g., tungsten, molybdenum, nickel, copper, and aluminum), conductive metal nitride materials (e.g., titanium nitride and tantalum nitride), and/or transition metals (e.g., titanium and tantalum). The first and second interlayer insulating layers ILD1 and ILD2 may be formed of or may include silicon oxide, silicon nitride, silicon oxynitride, and/or low-k dielectric materials. For example, the first and second interlayer insulating layers ILD1 and ILD2 may be formed of or may include high density plasma (HDP) oxide and/or tetraethylorthosilicate (TEOS).

In an embodiment, the semiconductor device may be a vertical-type NAND FLASH memory device, and in this case, the first and second conductive patterns GE1 and GE2 of the stack ST may be used as the gate lower lines LL1 and LL2, the word lines WL, and the gate upper lines UL1 and UL2 described with reference to FIG. 1.

Planarization insulating layers 110*a* and 110*b* may cover staircase end portions (i.e., the pad portions) of the stack ST. The planarization insulating layers 110*a* and 110*b* may have a substantially flat top surface. The planarization insulating layers 110*a* and 110*b* may include a single insulating layer or a plurality of stacked insulating layers. In an embodiment, the planarization insulating layers 110*a* and 110*b* may include a first planarization insulating layer 110*a*, which covers the staircase structure of the first stack ST1, and a second planarization insulating layer 110*b*, which covers the staircase structure of the second stack ST2. The planarization insulating layers 110*a* and 110*b* may have substantially flat top and bottom surfaces. The top surface of the planarization insulating layer 110*a* or 110*b* may be substantially coplanar with a top surface of the uppermost interlayer insulating layer ILD1 of the stack ST, and the bottom surface of the planarization insulating layer 110*a* or 110*b* may be substantially coplanar with a bottom surface of the lowermost interlayer insulating layer ILD2 of the stack ST.

The source conductive pattern CST may be disposed on the uppermost one of the first interlayer insulating layers ILD1 of the first stack ST1. The source conductive pattern CST may correspond to the common source line 3205 or 4205 of FIG. 3 or 4. The source conductive pattern CST may have a uniform thickness. The source conductive pattern CST may be extended in the first and second directions D1 and D2, in the cell array region CAR and the first connection region CNR1. When measured in the first direction D1, a length of the source conductive pattern CST may be larger than a length of the uppermost one of the first conductive patterns GE1 of the first stack ST1.

In an embodiment, the source conductive pattern CST may include a semiconductor layer 301 and a metal layer 303.

The semiconductor layer 301 may be in contact with the first vertical structures VS1. The semiconductor layer 301 may be formed of or may include a semiconductor material (e.g., doped silicon) that is doped with impurities of a first conductivity type (e.g., n-type). The metal layer 303 may be formed of or may include, metallic materials (e.g., tungsten, molybdenum, nickel, copper, and aluminum), conductive metal nitrides (e.g., titanium nitride and tantalum nitride), and/or transition metals (e.g., titanium and tantalum). In an embodiment, the source conductive pattern SCT may be formed of or may include one or more metallic materials (e.g., tungsten). A metal silicide layer may be interposed between the semiconductor layer 301 and the metal layer 303.

Upper conductive patterns CP may be disposed on a top surface of the first planarization insulating layer 110*a* in the second connection region CNR2 and may be located at substantially the same level as the source conductive pattern CST. The upper conductive patterns CP may be formed of or may include the same conductive material as the source conductive pattern CST. The input/output contact plugs IOPLG may be electrically connected to an input/output pad PAD through an upper via VA.

The first vertical structures VS1 may penetrate the stack ST in the cell array region CAR and may be connected to the source conductive pattern CST. The first vertical structures VS1 may be arranged in a specific direction or in a zigzag shape, when viewed in a plan view. The second vertical structures VS2 may penetrate the stack ST in the first connection region CNR1.

In the first connection region CNR1, the second vertical structures VS2 may penetrate the end portions (i.e., the pad portions) of the first and second conductive patterns GE1 and GE2. The second vertical structures VS2 may have substantially the same structure as the first vertical structures VS1 and may be formed of or may include the same material as the first vertical structures VS1.

When viewed in a plan view, shapes and sizes of the second vertical structures VS2 may be different from those of the first vertical structures VS1. Top surfaces of the second vertical structures VS2 may have various shapes (e.g., circular, elliptical, and bar shapes). The second vertical structures VS2 may be disposed to enclose each of the cell contact plugs CPLG. In the case where the second vertical structures VS2 have elliptical top surfaces, the second vertical structures VS2 in each pad portion of the first and second conductive patterns GE1 and GE2 may be disposed to have long axes oriented in at least two different directions. In an embodiment, a plurality of the second vertical structures VS2 may be provided between adjacent ones of the cell contact plugs CPLG.

In an embodiment, each of the first vertical structures VS1 may be provided in a vertical channel hole penetrating the stack ST. In an embodiment, the vertical channel hole may include first vertical channel holes, which penetrate the first stack ST1, and second vertical channel holes, which penetrate the second stack ST2 and are connected to the first vertical channel holes.

Each of the first vertical structures VS1 may include a first vertical extended portion in the first vertical channel hole and a second vertical extended portion in the second vertical channel hole. The first and second vertical extended portions may be a single structure which is continuously extended without any observable interface. Here, the first vertical extended portion may have a side surface whose slope is substantially constant from top to bottom. Similarly, the second vertical extended portion may have a side surface whose slope is substantially constant from top to bottom. For example, as a distance from the semiconductor substrate 200 increases, each of the first and second vertical extended portions may have a width decreasing in the first or second direction D1 or D2. The first and second vertical extended portions may have different diameters at a level of the interface therebetween. For example, the first and second vertical extended portions may form a stepwise structure near the interface therebetween.

However, the inventive concept is not necessarily limited to this example, and in an embodiment, each of the first vertical structures VS1 may include three or more vertical extended portions, which are provided to form the stepwise structure at two or more levels, unlike that illustrated in the drawings. Alternatively, each of the first vertical structures VS1 may have a flat side surface without any stepwise portion.

Figure 7:
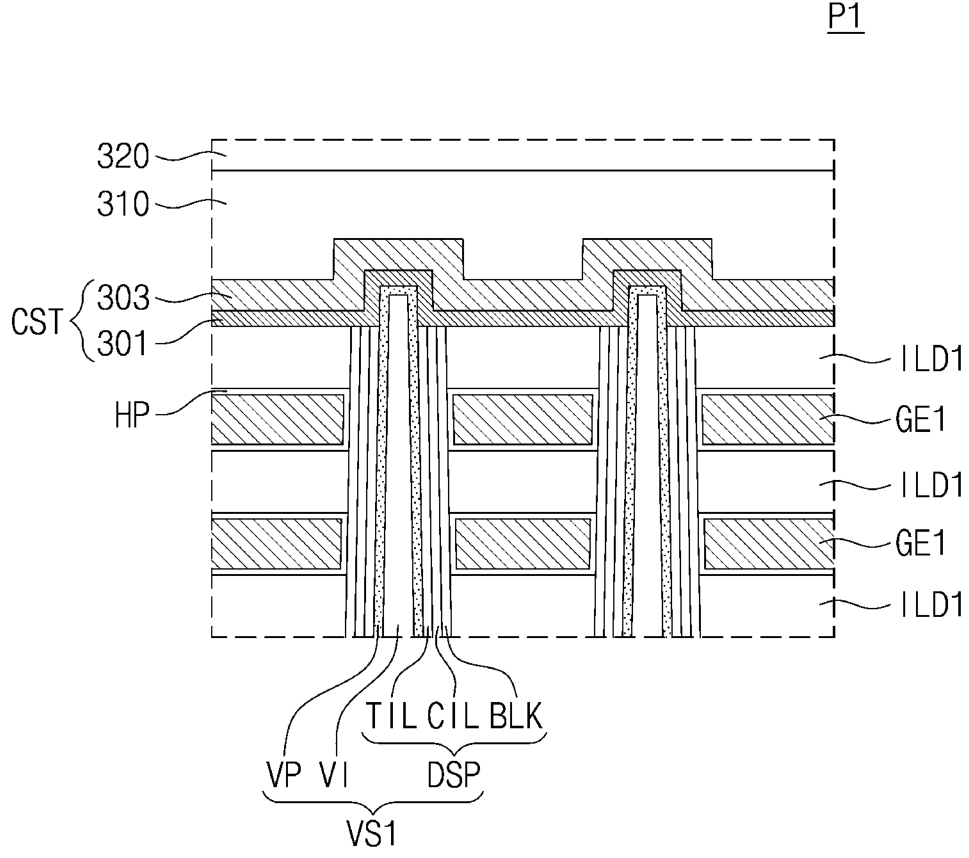
FIG. 7 is an enlarged cross-sectional view illustrating a portion 'P1' of FIG. 6A.

Referring to FIG. 7, the first vertical structures VS1 may be extended to penetrate the stack ST in the third direction D3, which is perpendicular to the top surface of the semiconductor substrate 200, and may be connected to the source conductive pattern CST.

Each of the first vertical structures VS1 may include a vertical channel pattern VP, a data storage pattern DSP, and a vertical insulating pattern VI.

For example, the vertical channel pattern VP may have the shape of a pipe or macaroni with closed top and bottom. The vertical channel pattern VP may have an inner side surface defining an internal space and an outer side surface adjacent to the stack ST. The vertical channel pattern VP may enclose the outer side surface of the vertical insulating pattern VI, and a portion of the vertical channel pattern VP may be disposed between the source conductive pattern CST and the vertical insulating pattern VI.

The vertical channel pattern VP may be formed of or may include one or more semiconductor materials (e.g., silicon (Si) and germanium (Ge)). The vertical channel pattern VP, which includes the semiconductor material, may be used as channel patterns of the upper transistors UT1 and UT2, the memory cell transistors MCT, and the lower transistors LT1 and LT2 described with reference to FIG. 1.

The vertical channel pattern VP may be connected to the source conductive pattern CST. The vertical channel pattern VP may be in contact with the semiconductor layer 301 of the source conductive pattern CST. A top surface of the vertical channel pattern VP may be located at a level higher than a top surface of the uppermost one of the interlayer insulating layers ILD1.

The data storage pattern DSP may be extended in the third direction D3 to enclose the outer side surface of each of the vertical channel patterns VP. A top surface of the data storage pattern DSP may be located at a level lower than the top surface of the vertical channel pattern VP. The data storage pattern DSP may be a top-open pipe or macaroni-shaped structure. The data storage pattern DSP may be composed of one or more layers. In an embodiment, the data storage pattern DSP may be a data storage layer of a NAND FLASH memory device and may include a tunnel insulating layer TIL, a charge storing layer CIL, and a blocking insulating layer BLK, which are sequentially stacked on the side surface of the vertical channel pattern VP. For example, the charge storing layer CIL may be a trap insulating layer, a floating gate electrode, or an insulating layer with conductive nanodots.

Referring back to FIGS. 5, 6A, and 6B, a first interlayer insulating layer 120 may be disposed on the second planarization insulating layer 110*b* and the stack ST. The first interlayer insulating layer 120 may cover top surfaces of vertical structures VS.

First, second, and third separation structures SS1, SS2, and SS3 may penetrate the first interlayer insulating layer 120, the planarization insulating layers 110*a* and 110*b*, and the stack ST. Each of the first, second, and third separation structures SS1, SS2, and SS3 may include an insulating layer covering a side surface of the stack ST. Each of the first, second, and third separation structures SS1, SS2, and SS3 may have a single- or multi-layered structure. In an embodiment, the first, second, and third separation structures SS1, SS2, and SS3 may be formed of or may include one or more insulating materials (e.g., silicon oxide, silicon oxynitride, and silicon nitride).

The first separation structures SS1 may be extended from the cell array region CAR to the first connection region CNR1 in the first direction D1 and parallel to each other and may be spaced apart from each other in the second direction D2 crossing the first direction D1. In an embodiment, the stack ST may be disposed between the first separation structures SS1, which are adjacent to each other in the second direction D2.

The second separation structure SS2 may be provided in the cell array region CAR to penetrate the stack ST. The second separation structure SS2 may be disposed between the first separation structures SS1. When measured in the first direction D1, a length of the second separation structure SS2 may be smaller than a length of the first separation structure SS1. Alternatively, a plurality of second separation structures SS2 may be provided between the first separation structures SS1.

In the first connection region CNR1, the third separation structures SS3 may be spaced apart from the first and second separation structures SS1 and SS2 in the first direction D1 and may penetrate the planarization insulating layers 110*a* and 110*b* and the stack ST. The third separation structures SS3 may be extended in the first direction D1. The third separation structures SS3 may be spaced apart from each other in the first and second directions D1 and D2.

In an embodiment, reflection structures 130 may be disposed on the first, second, and third separation structures SS1, SS2, and SS3. The reflection structures 130 may be extended in the first direction D1 to be parallel to the first, second, and third separation structures SS1, SS2, and SS3. The reflection structures 130 may be overlapped with the first, second, and third separation structures SS1, SS2, and SS3, respectively. A width of each reflection structure 130 may be larger than a width of each of the first, second, and third separation structures SS1, SS2, and SS3.

The reflection structures 130 may prevent lower and upper conductive lines LCLa, LCLb, UCLa, and UCLb, the first and second bonding pads BP1 and BP2, and the peripheral circuit structure PS from being deteriorated by a laser beam in a laser annealing process, which is performed as a part of the process of fabricating a semiconductor device. The reflection structures 130 may be configured to reflect a laser beam passing through the first, second, and third separation structures SS1, SS2, and SS3, which are formed of an insulating material.

Each of the reflection structures 130 may include first material patterns 131 and second material patterns 133, which are alternately stacked on top of one another. The first and second material patterns 131 and 133 may be formed of materials whose refractive indices are different from each other. The first and second material patterns 131 and 133 may be formed of or may include an insulating material.

A refractive index of the first material patterns 131 may be greater than a refractive index of the second material patterns 133. In an embodiment, the first material patterns 131 may be a silicon nitride layer having a refractive index of about 1.0 to about 2.3. The second material patterns 133 may be a silicon oxide layer having a refractive index of about 1.3 to 1.6.

In an embodiment, thicknesses of the first and second material patterns 131 and 133 may be selected such that an incident light, which is incident into the reflection structure 130, is reflected by an interface of the first and second material patterns 131 and 133, resulting in constructive interference. For example, the thicknesses and materials of the first and second material patterns 131 and 133 may be selected to meet the condition for Bragg's reflection.

A thickness of each of the first material patterns 131 may be smaller than a thickness of each of the second material patterns 133. Each of the first material patterns 131 may have a thickness of about 500 Å to 700 Å. Each of the second material patterns 133 may have a thickness of about 850 Å to 1000 Å.

A second interlayer insulating layer 140 may be provided on the first interlayer insulating layer 120 and may cover the reflection structures 130. In an embodiment, the second interlayer insulating layer 140 may cover side surfaces of the reflection structures 130.

In an embodiment, a bit line conductive pad may be formed on a bottom end of the first vertical structure VS1, and lower bit line contact plugs BCTa may penetrate the first interlayer insulating layer 120 and may be in contact with the bit line conductive pad. The bit line conductive pad may be formed of an undoped semiconductor material, a doped semiconductor material, or a conductive material. Upper bit line contact plugs BCTb may penetrate the second interlayer insulating layer 140 and may be coupled to the lower bit line contact plugs BCTa.

In the first connection region CNR1, the cell contact plugs CPLG may penetrate the first and second interlayer insulating layers 120 and 140 and the planarization insulating layers 110*a* and 110*b* and may be coupled to the pad portions of the first and second conductive patterns GE1 and GE2, respectively. The smaller the distance to the cell array region CAR, the smaller the vertical lengths of the cell contact plugs CPLG. The cell contact plugs CPLG may have top surfaces that are substantially coplanar with each other.

In the second connection region CNR2, the peripheral contact plugs PPLG and the input/output contact plugs IOPLG may penetrate the first and second interlayer insulating layers 120 and 140 and the planarization insulating layers 110*a* and 110*b* and may be coupled to the upper conductive patterns CP.

Each of the cell, peripheral, and input/output contact plugs CPLG, PPLG, and IOPLG may include a barrier metal layer, which is formed of or includes a conductive metal nitride material (e.g., titanium nitride and tantalum nitride), and a metal layer, which is formed of or includes a metallic material (e.g., tungsten, titanium, and tantalum).

In the cell array region CAR, the bit lines BL may be disposed on the second interlayer insulating layer 140. The bit lines BL may be extended in the second direction D2 to cross the stack ST. The bit lines BL may be electrically connected to the first vertical structures VS1 through the lower and upper bit line contact plugs BCTa and BCTb.

The first lower conductive lines LCLa may be disposed on the second interlayer insulating layer 140 in the first connection region CNR1 and may be coupled to the cell contact plugs CPLG.

The second lower conductive lines LCLb may be disposed on the second interlayer insulating layer 140 in the second connection region CNR2 and may be coupled to the peripheral and input/output contact plugs PPLG and IOPLG.

A third interlayer insulating layer 150 may be disposed on the second interlayer insulating layer 140, and the bit lines BL and the first and second lower conductive lines LCLa and LCLb may be disposed in the third interlayer insulating layer 150.

A fourth interlayer insulating layer 160 may be disposed on the third interlayer insulating layer 150, and first and second upper conductive lines UCLa and UCLb may be disposed in the fourth interlayer insulating layer 160. In the cell array region CAR, the first upper conductive lines UCLa may be electrically connected to the bit lines BL. In the first and second connection regions CNR1 and CNR2, the second upper conductive lines UCLb may be electrically connected to the first and second lower conductive lines LCLa and LCLb.

The first and second lower conductive lines LCLa and LCLb and the first and second upper conductive lines UCLa and UCLb may be formed of or may include metallic materials (e.g., tungsten, copper, and aluminum), conductive metal nitride materials (e.g., titanium nitride and tantalum nitride), and/or transition metals (e.g., titanium and tantalum). For example, the first and second lower conductive lines LCLa and LCLb may be formed of or may include a material (e.g., tungsten) having relatively high electric resistivity, and the first and second upper conductive lines UCLa and UCLb may be formed of or may include a material (e.g., copper) having relatively low electric resistivity.

A fifth interlayer insulating layer 170 may be disposed on the fourth interlayer insulating layer 160, and the second bonding pads BP2 may be disposed in the fifth interlayer insulating layer 170. The second bonding pads BP2 may be provided in the uppermost interlayer insulating layer 170. The second bonding pads BP2 may be electrically connected to the first and second upper conductive lines UCLa and UCLb. The second bonding pads BP2 may be formed of or may include aluminum, copper, and/or tungsten.

The second bonding pads BP2 may be electrically and physically connected to the first bonding pads BP1 by a bonding method. For example, the second bonding pads BP2 may be in direct contact with the first bonding pads BP1.

The second bonding pads BP2 may include the same metallic material as the first bonding pads BP1. The second bonding pads BP2 may be substantially the same as the first bonding pads BP1 in terms of shape, width, or area.

An upper insulating layer 310 may cover the source conductive pattern CST and the upper conductive patterns CP. Input/output pads IOPAD may be disposed on the upper insulating layer 310. A capping insulating layer 320 may be disposed on the upper insulating layer 310 and may cover the input/output pads IOPAD.

The capping insulating layer 320 and a passivation layer 340 may sequentially cover the upper insulating layer 310. The capping insulating layer 320 may be, for example, a silicon nitride layer or a silicon oxynitride layer. The passivation layer 340 may be formed of or may include polyimide-based materials (e.g., photo sensitive polyimide (PSPI)).

The capping insulating layer 320 and the passivation layer 340 may have a pad opening OP, which is formed to expose a portion of the input/output pad IOPAD.

FIGS. 8, 9, 10, and 11 are cross-sectional views, which are taken along the line A-A' of FIG. 5 to illustrate a semiconductor device according to an embodiment of the inventive concepts. In the following description, a previously described element may be identified by the same reference number without repeating an overlapping description thereof, for the sake of brevity. To the extent that an element is not described in this section, it may be understood that the element is at least similar to corresponding elements that have been described in other sections.

Figure 8:
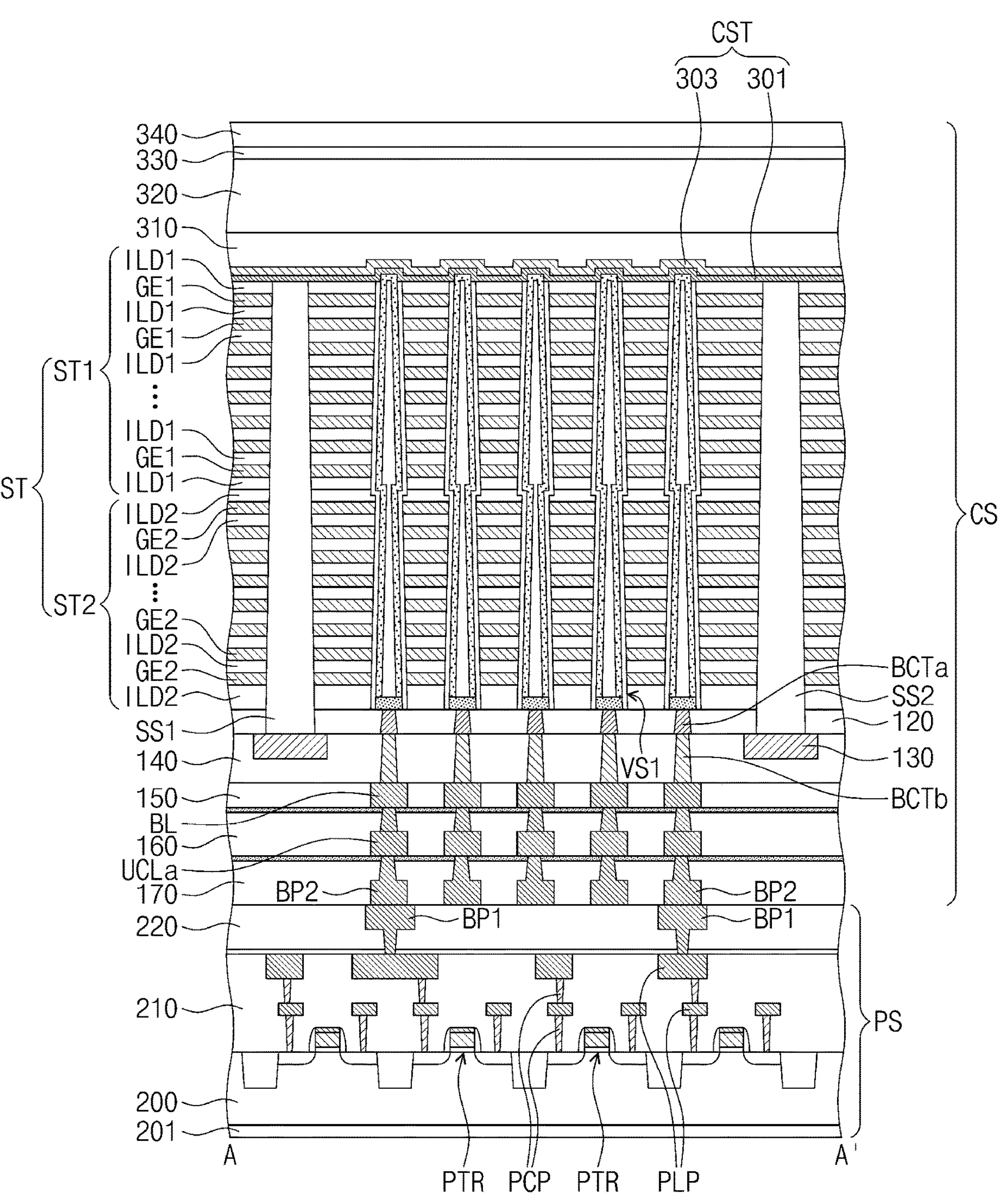
FIGS. 8, 9, 10, and 11 are cross-sectional views, which are taken along the line A-A' of FIG. 5 to illustrate a semiconductor device according to an embodiment of the inventive concepts.

Referring to FIG. 8, the reflection structure 130 may be disposed on the first interlayer insulating layer 120 and may overlap with the first, second, and third separation structures SS1, SS2, and SS3, as described above. Here, the reflection structure 130 may be a dummy metal pattern, which is placed on the first, second, and third separation structures SS1, SS2, and SS3 and has a specific thickness. The dummy metal pattern may be completely enclosed by the first, second, and third separation structures SS1, SS2, and SS3 and the first and second interlayer insulating layers 120 and 140. The dummy metal pattern may have a totally-isolated structure and may be in an electrically-floated state.

The dummy metal pattern may be formed of or may include one or more metallic materials (e.g., tungsten, molybdenum, nickel, copper, and/or aluminum), conductive metal nitrides (e.g., titanium nitride and tantalum nitride), and/or transition metals (e.g., titanium and tantalum).

Figure 9:
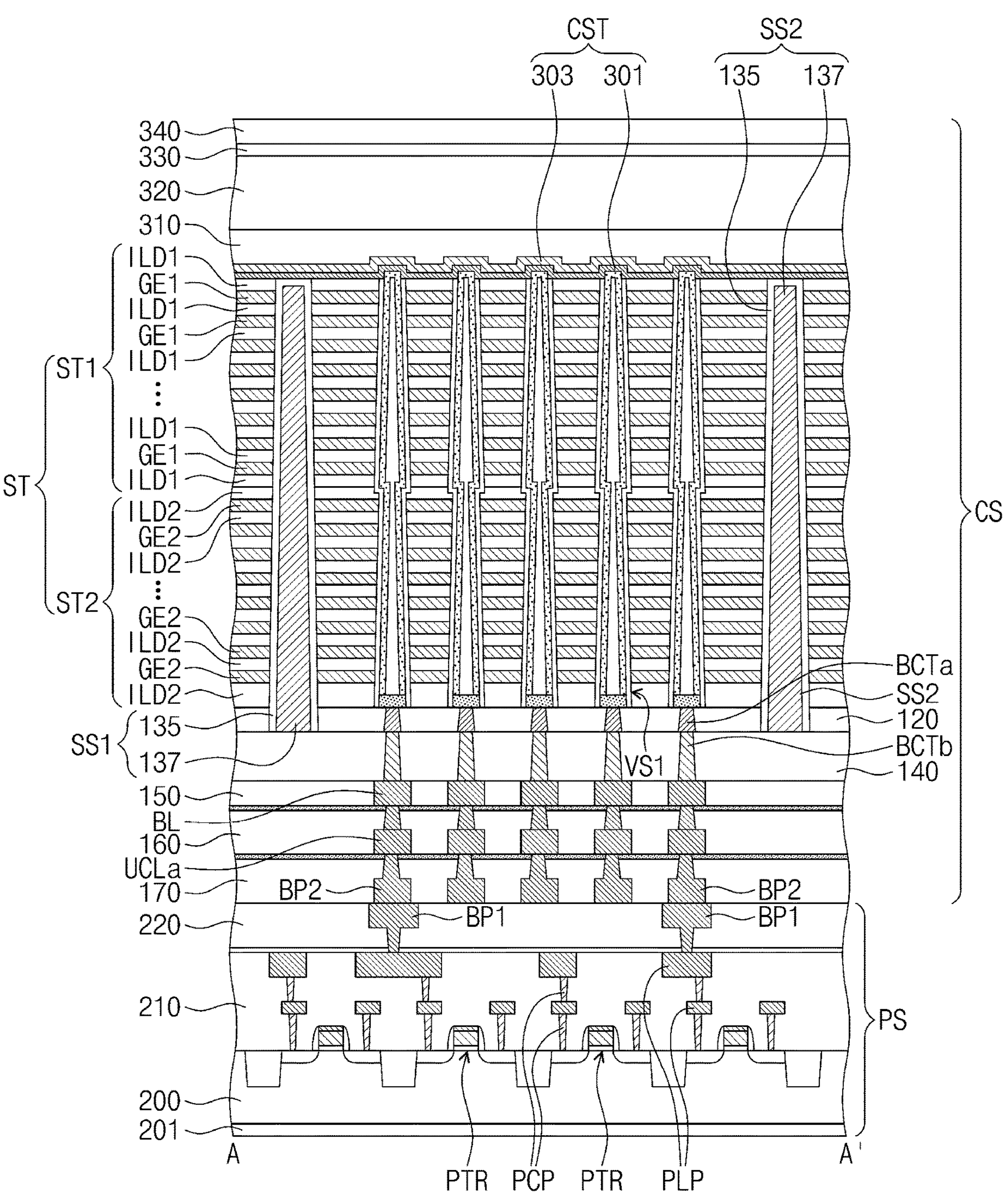
Figure 10:
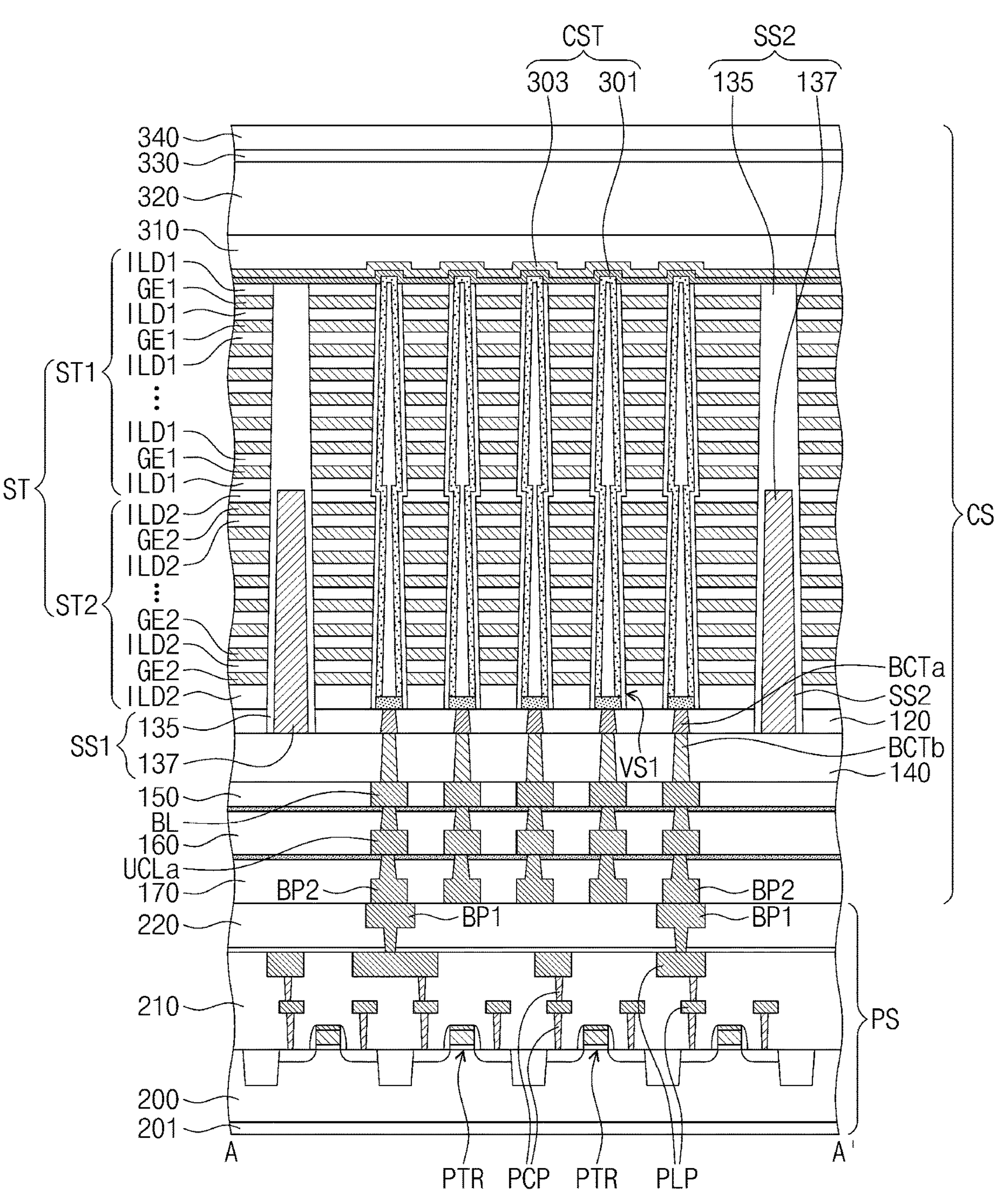

Referring to FIGS. 9 and 10, the reflection structures in the previous embodiments may be omitted, and instead, each of the first, second, and third separation structures SS1, SS2, and SS3 may include a separation insulating pattern 135 and an absorption pattern 137.

The separation insulating pattern 135 may be disposed between the absorption pattern 137 and the side surfaces of the stacks ST and may also be disposed between the absorption pattern 137 and the source conductive pattern CST. The separation insulating pattern 135 may be in direct contact with side surfaces of the first and second conductive patterns GE1 and GE2. The separation insulating pattern 135 may be formed of or may include an insulating material (e.g., silicon oxide).

The absorption pattern 137 may absorb a laser beam, which is incident into the first, second, and third separation structures SS1, SS2, and SS3, when a laser annealing process is performed as a part of the process of fabricating a semiconductor device. The absorption pattern 137 may be formed of or may include a material having an extinction coefficient of about 0.5 or higher. As an example, the absorption pattern 137 may be formed of or may include a material having an extinction coefficient of about 0.5 to 10.0. The absorption pattern 137 may be formed of or may include undoped semiconductor materials, doped semiconductor materials (e.g., doped silicon), metallic materials (e.g., tungsten, molybdenum, nickel, copper, and aluminum), conductive metal nitride materials (e.g., titanium nitride and tantalum nitride), and/or transition metal materials (e.g., titanium and tantalum).

The absorption pattern 137 may have a vertical length that is shorter than the separation insulating pattern 135. The absorption pattern 137 may be completely enclosed by an insulating material. A bottom surface of the absorption pattern 137 may be in direct contact with the second interlayer insulating layer 140. The absorption pattern 137 may have a totally-isolated structure and may be in an electrically-floated state.

In the embodiment shown in FIG. 10, the absorption pattern 137 may penetrate the second stack ST2, and the separation insulating pattern 135 may fill a space between the first stacks ST1. A vertical length of the absorption pattern 137 in the third direction D3 may be smaller than the vertical length of the separation insulating pattern 135.

Figure 11:
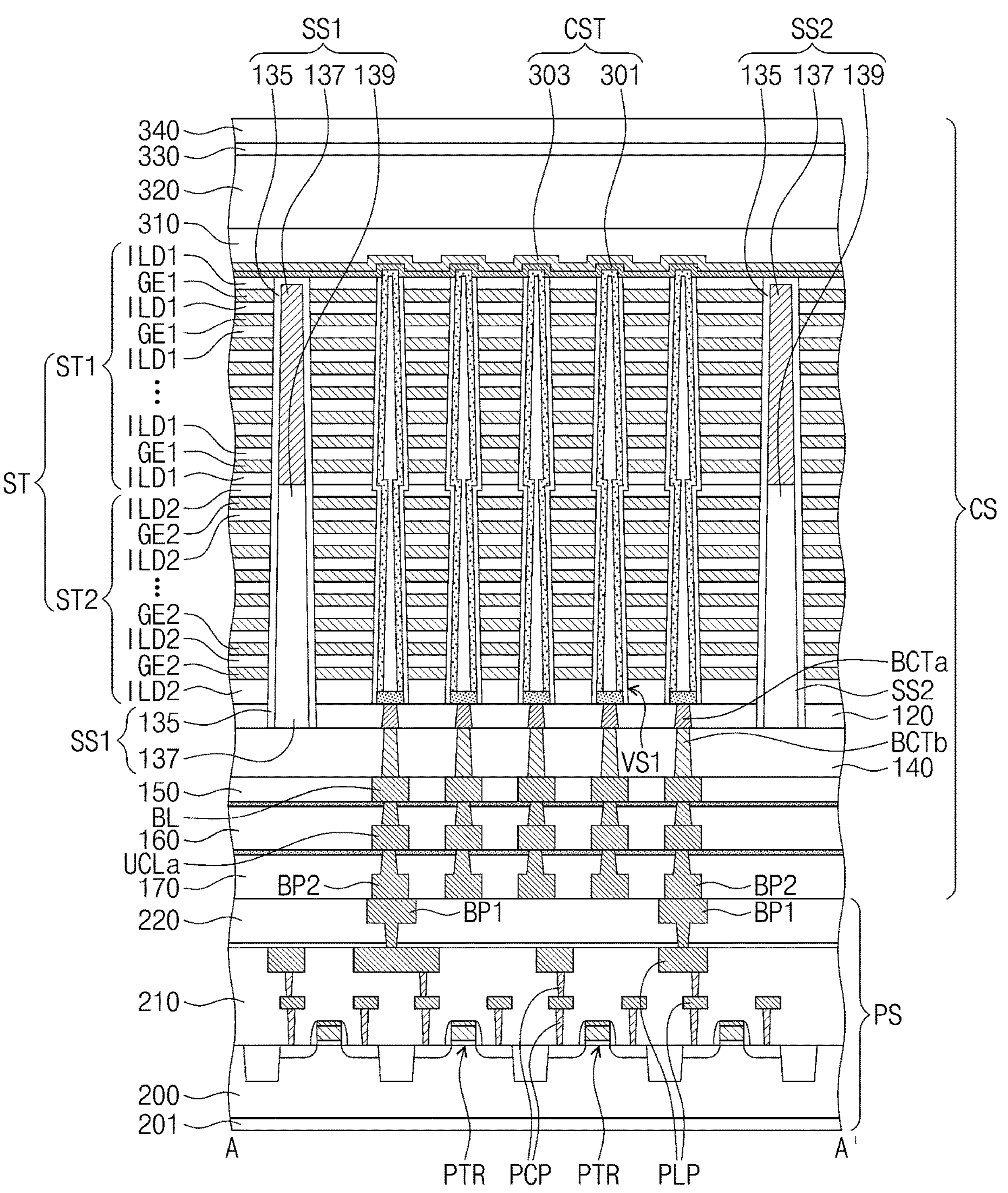

Referring to FIG. 11, each of the first, second, and third separation structures SS1, SS2, and SS3 may include the separation insulating pattern 135, the absorption pattern 137, and an insulating gap-fill pattern 139. In an embodiment, the absorption pattern 137 may penetrate the first stack ST1, and the insulating gap-fill pattern 139 may penetrate the second stack ST2. The absorption pattern 137 may be completely enclosed by the separation insulating pattern 135 and the insulating gap-fill pattern 139.

FIGS. 12 to 20 are cross-sectional views, which are taken along the line A-A' of FIG. 5 to illustrate a method of fabricating a semiconductor device according to an embodiment of the inventive concept.

Figure 12:
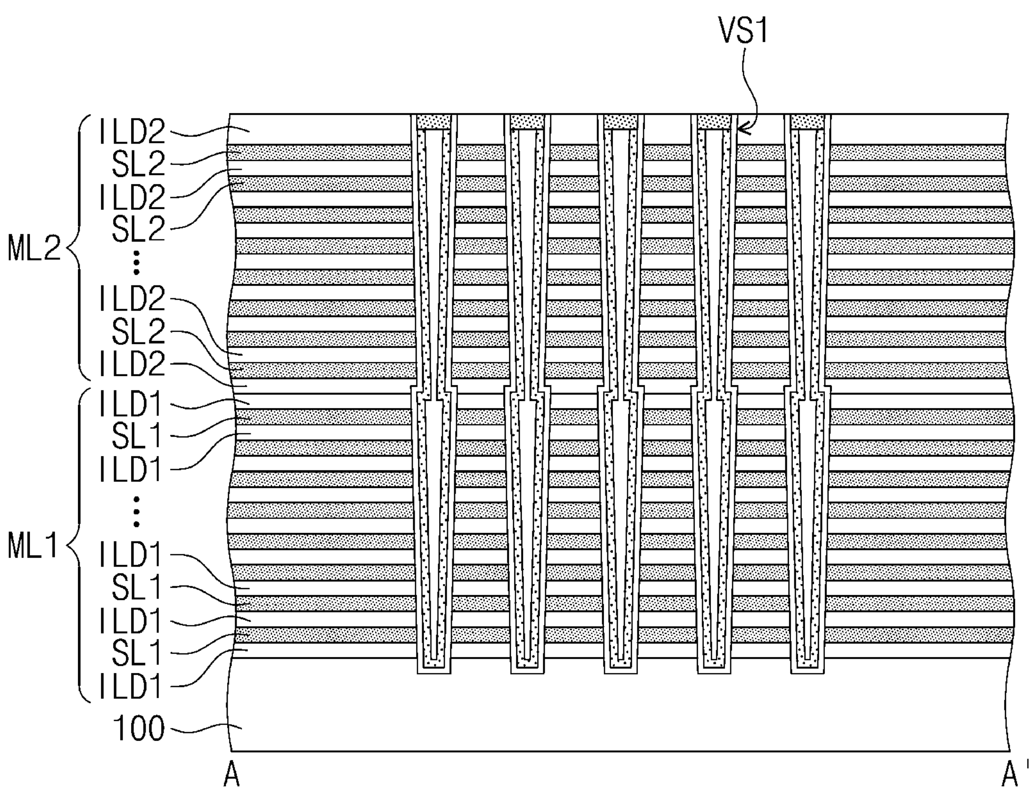
FIGS. 12 to 20 are cross-sectional views, which are taken along the line A-A' of FIG. 5 to illustrate a method of fabricating a semiconductor device according to an embodiment of the inventive concept.

Referring to FIGS. 5 and 12, a first mold structure ML1 may be formed on a first substrate 100.

The formation of the first mold structure ML1 may include forming a first layered structure, in which the first interlayer insulating layers ILD1 and first sacrificial layers SL1 are vertically and alternately stacked, and repeatedly performing a patterning process on the first layered structure. Accordingly, the first mold structure ML1 may have a staircase structure in the first connection region CNR1.

The first interlayer insulating layers ILD1 and the first sacrificial layers SL1 may be deposited by a thermal chemical vapor deposition (Thermal CVD) process, a plasma-enhanced chemical vapor deposition (PE-CVD) process, a physical chemical vapor deposition (physical CVD) process, or an atomic layer deposition (ALD) process.

The first sacrificial layers SL1 of the first mold structure ML1 may be formed of a material which can be etched with a high etch selectivity with respect to the first interlayer insulating layers ILD1. In an embodiment, the first sacrificial layers SL1 may be formed of or may include an insulating material that is different from the first interlayer insulating layers ILD1. For example, the first sacrificial layers SL1 may be formed of or may include silicon nitride, and the first interlayer insulating layers ILD1 may be formed of or may include silicon oxide.

After the formation of the first mold structure ML1, the first planarization insulating layer 110*a* may cover the staircase structure of the first mold structure ML1.

Next, a second mold structure ML2 may be formed on the first mold structure ML1. In an embodiment, vertical sacrificial patterns may penetrate the first mold structure MHL1, before the formation of the second mold structure ML2.

The formation of the second mold structure ML2 may be substantially the same as the formation of the first mold structure ML1 described above. For example, the formation of the second mold structure ML2 may include forming a second layered structure, in which second interlayer insulating layers ILD2 and second sacrificial layers SL2 are vertically and alternately stacked, on the first mold structure ML1, and repeatedly performing a patterning process on the second layered structure. Accordingly, the second mold structure ML2 may have a staircase structure in the first connection region CNR1.

The second sacrificial layers SL2 may be formed of or may include the same material as the first sacrificial layers SL1 and may have substantially the same thickness as the first sacrificial layers SL1. The second sacrificial layers SL2 may be formed of or may include an insulating material that is different from the second interlayer insulating layers ILD2. The second sacrificial layers SL2 may be formed of or may include the same material as the first sacrificial layers SL1. For example, the second sacrificial layers SL2 may be formed of or may include silicon nitride, and the second interlayer insulating layers ILD2 may be formed of or may include silicon oxide.

After the formation of the second mold structure ML2, the second planarization insulating layer 110*b* may cover the staircase structure of the second mold structure MHL2.

Next, vertical channel holes may penetrate the first and second mold structures ML1 and ML2 and to expose the first substrate 100. In the case where the vertical sacrificial patterns are formed in the first mold structure ML1, the formation of the vertical channel holes may include removing the vertical sacrificial patterns to expose the first substrate 100.

When the vertical channel holes are formed, dummy channel holes may be formed in the first connection region CNR1 to penetrate the planarization insulating layers 110*a* and 110*b* and at least a portion of the first and second mold structures ML1 and ML2.

The formation of the vertical channel holes may include forming a hard mask pattern on the second mold structure ML2 and anisotropically etching the first and second mold structures ML1 and ML2 using the hard mask pattern as an etch mask. The anisotropic etching process of forming the vertical channel holes may be performed in an over-etching manner, and in this case, a top surface of the first substrate 100 exposed by the vertical channel holes may be recessed to specific depths. Furthermore, the recess depths of the first substrate 100 may vary depending on positions of the vertical channel holes in the anisotropic etching process of forming the vertical channel holes.

Next, the first vertical structures VS1 may be formed in the vertical channel holes of the cell array region CAR, and the second vertical structures VS2 may be formed in the dummy channel holes of the first connection region CNR1.

The formation of the first and second vertical structures VS1 and VS2 may include sequentially depositing the data storage layer DSL (e.g., of FIG. 16) and the vertical channel layer SE (e.g., of FIG. 16) in the vertical channel holes and etching and planarizing the data storage layer and the vertical channel layer.

The data storage layer may be conformally deposited on bottom and side surfaces of the vertical channel holes by a chemical vapor deposition (CVD) method or an atomic layer deposition (ALD) method. The data storage layer may include a blocking insulating layer, a charge storing layer, and a tunnelling insulating layer, which are sequentially stacked in the vertical channel holes. The vertical channel layer may be conformally deposited on the data storage layer by a chemical vapor deposition (CVD) method or an atomic layer deposition (ALD) method. After the formation of the data storage layer and the vertical channel layer, the vertical channel holes may be filled with a gapfill insulating layer. Accordingly, the data storage pattern DSP, the vertical channel pattern VP, and the vertical insulating pattern VI may be formed in each vertical channel hole, as described above.

Next, the bit line conductive pads may be formed in top portions of the vertical channel patterns VP. The bit line conductive pads may be an impurity-doped region or may be formed of or may include one or more conductive materials. Top surfaces of the bit line conductive pads may be coplanar with a top surface of the uppermost second upper insulating layer ILD2.

Figure 13:
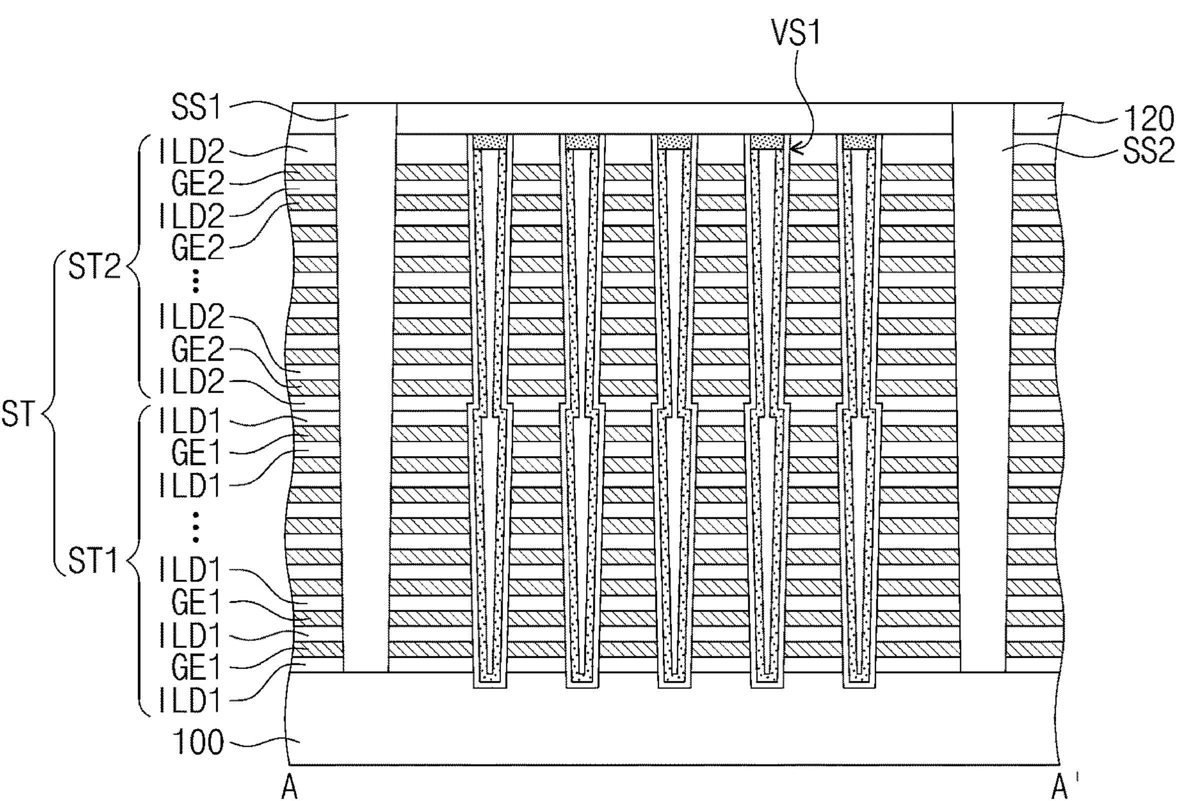

Referring to FIGS. 5 and 13, the first interlayer insulating layer 120 may be formed on the planarization insulating layer 110*b* and may cover top surfaces of the first and second vertical structures VS1 and VS2.

Next, a process may be performed to replace the first and second sacrificial layers SL1 and SL2 of the first and second mold structures ML1 and ML2 with the first and second conductive patterns GE1 and GE2. Accordingly, the stack ST may be formed on the first substrate 100.

The process of replacing the first and second sacrificial layers SL1 and SL2 with the first and second conductive patterns GE1 and GE2 may include isotropically etching the first and second sacrificial layers SL1 and SL2 using an etch recipe having an etch selectivity with respect to the first and second interlayer insulating layers ILD1 and ILD2, the first and second vertical structures VS1 and VS2, and the first substrate 100.

After the formation of the stack ST, the second interlayer insulating layer 140 may be formed on the first interlayer insulating layer 120, and then, the cell contact plugs CPLG, which are connected to the stack ST, the peripheral contact plugs PPLG, and the input/output contact plug IOPLG may be formed.

The formation of the peripheral contact plugs PPLG and the input/output contact plug IOPLG may include forming contact holes to penetrate the first interlayer insulating layers 120 and the planarization insulating layer 110*a* and 110*b* in the second connection region CNR2 and to expose the first substrate 100 and filling the contact holes with a conductive material.

Figure 14:
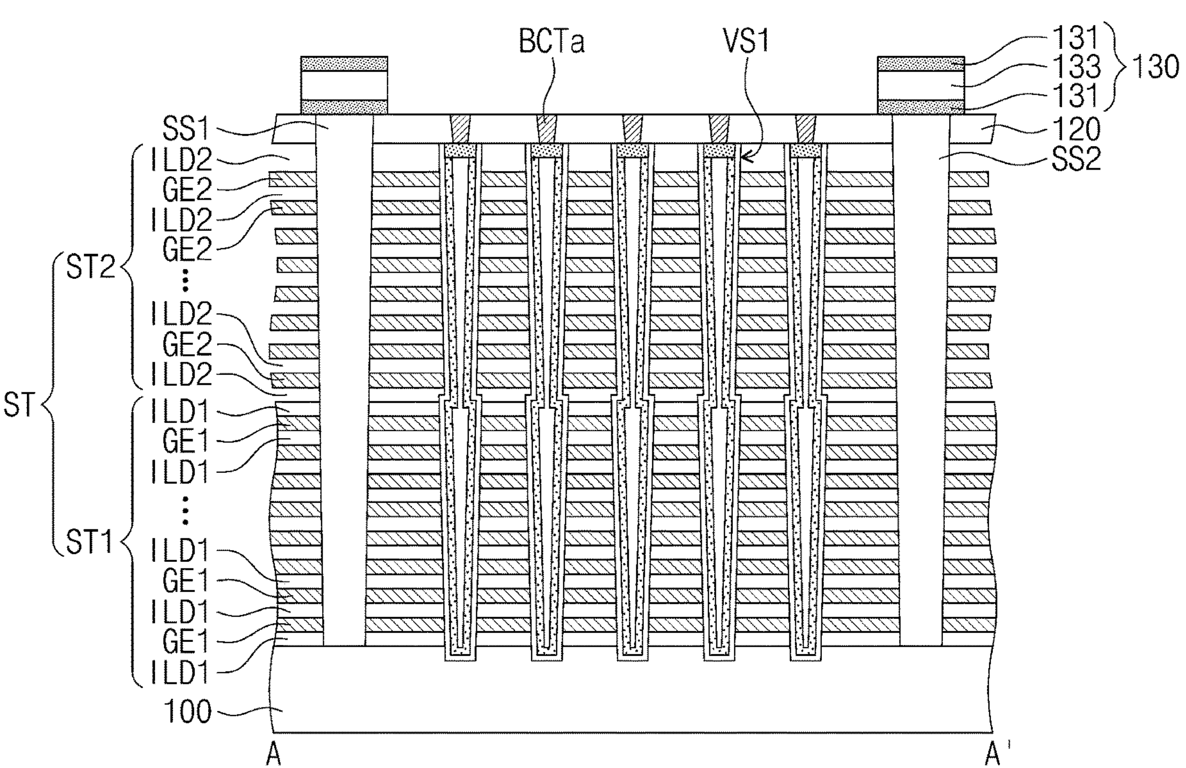

Referring to FIGS. 5 and 14, the lower bit line contact plugs BCTa, which are coupled to the first vertical structures VS1, may penetrate the first interlayer insulating layer 120. The lower bit line contact plugs BCTa may be in contact with the bit line conductive pads of the first vertical structures VS1. The bit line conductive pad may be formed of or may include undoped semiconductor materials, doped semiconductor materials, and/or conductive materials.

Thereafter, the reflection structures 130 may be formed on the first interlayer insulating layer 120.

The reflection structures 130 may be formed by alternately forming first material layers and a second material layer on the first interlayer insulating layer 120 and patterning the first and second material layers using a mask pattern extending in the first direction D1. Thus, each of the reflection structures 130 may include the first and second material patterns 131 and 133.

Here, the first material layers may have a first thickness and a first refractive index, and the second material layer may have a second thickness, which is larger than the first thickness, and a second refractive index, which is smaller than the first refractive index. The thicknesses of the first and second material layers may be changed, depending on a wavelength of a laser beam, which will be used in a subsequent process, and the refractive indices of the first and second material layers. In an embodiment, the thicknesses of the first and second material layers may be selected such that a laser beam incident through the first, second, and third separation structures SS1, SS2, and SS3 is reflected by interfaces of the first and second material layers, resulting in constructive interference.

The reflection structures 130, which are formed by the above process, may have a line shape extending in the first direction D1 and may be overlapped with the first, second, and third separation structures SS1, SS2, and SS3.

In an embodiment, the first, second, and third separation structures SS1, SS2, and SS3 may include the separation insulating pattern and the absorption pattern, as shown in FIGS. 9, 10, and 11, instead of the formation of the reflection structures 130.

Figure 15:
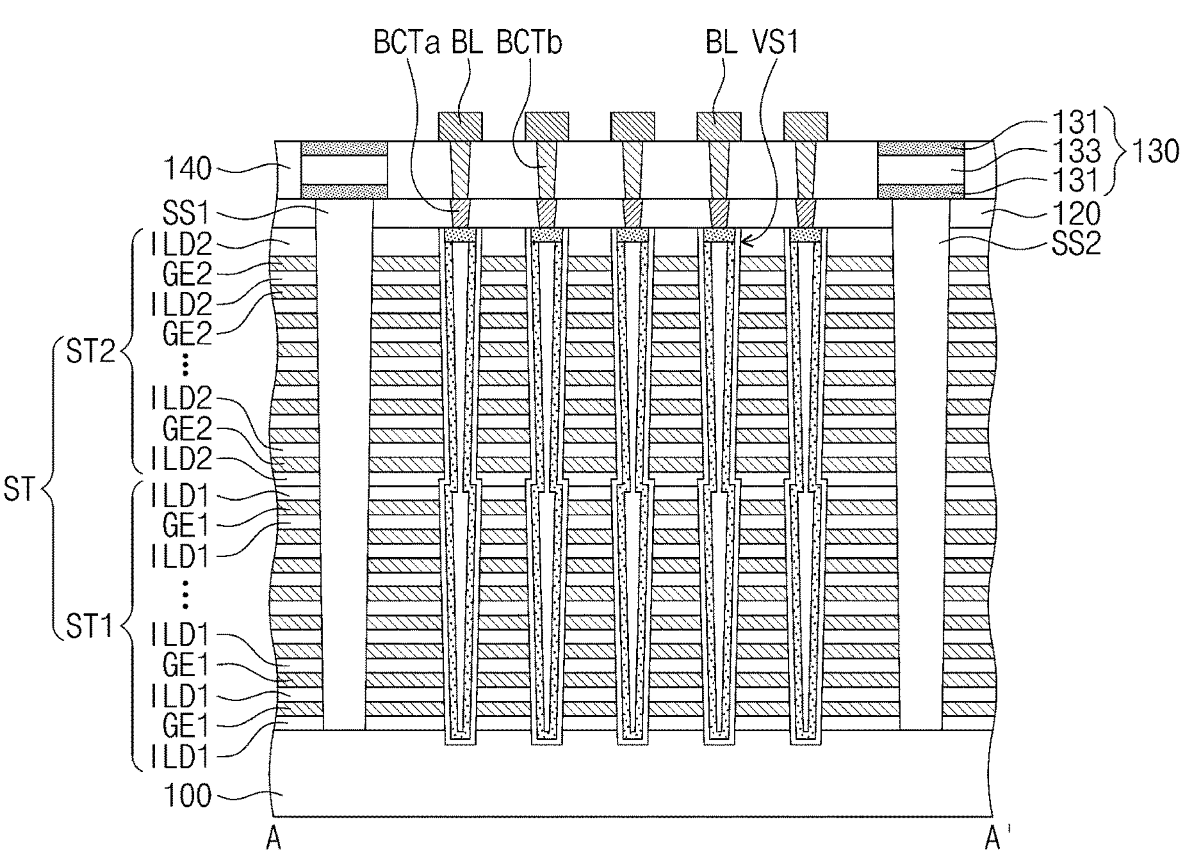

Next, referring to FIGS. 5 and 15, the second interlayer insulating layer 140 may be formed on the first interlayer insulating layer 120, after the formation of the reflection structures 130.

The second interlayer insulating layer 140 may be formed by depositing an insulating layer covering the reflection structures 130 and performing a planarization process on the insulating layer to expose the first material pattern 131 of the reflection structure.

Next, the upper bit line contact plugs BCTb may penetrate the second interlayer insulating layer 140 and may be coupled to the lower bit line contact plugs BCTa. Furthermore, the cell contact plugs CPLG, the peripheral contact plugs PPLG, and the input/output contact plug IOPLG may be formed in the first and second connection regions CNR1 and CNR2, as shown in FIG. 6B.

Referring to FIG. 15, the bit lines BL may be formed on the second interlayer insulating layer 140. The bit lines BL may be connected to the upper bit line contact plugs BCTb.

The lower conductive lines (e.g., LCLa and LCLb of FIG. 6B), which are connected to the cell contact plugs CPLG, may be formed in the first and second connection regions CNR1 and CNR2.

Figure 16:
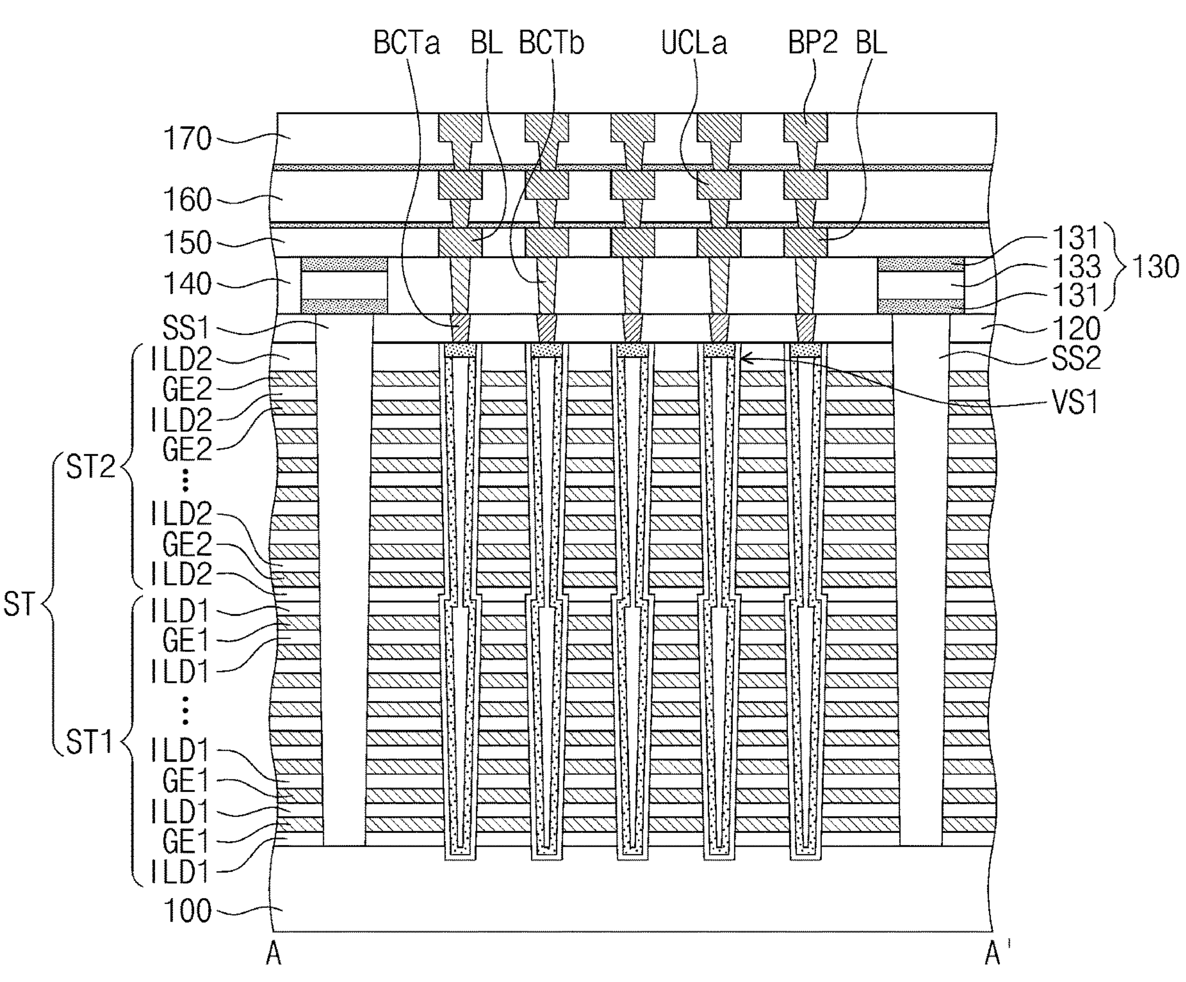

Referring to FIGS. 5 and 16, the third, fourth, and fifth interlayer insulating layers 150, 160, and 170 may be stacked on the second interlayer insulating layer 140, and the first upper conductive lines UCLa may be formed on the third interlayer insulating layer 150. The first upper conductive lines UCLa may be connected to the bit lines BL. Referring back to FIG. 6B, the second upper conductive lines UCLb may be formed in the second connection region CNR2, when the first upper conductive lines UCLa are formed in the first connection region CNR1, and the second upper conductive lines UCLb may be connected to the first lower conductive lines LCLa.

The first bonding pads BP1 may be formed in the fifth interlayer insulating layer 170 and may be connected to the first and second upper conductive lines UCLa and UCLb (e.g., of FIG. 6B).

The first and second upper conductive lines UCLa and UCLb (e.g., of FIG. 6B) and the first bonding pads BP1 may be formed using a damascene process. The first bonding pads BP1 may have top surfaces that are substantially coplanar with a top surface of the fifth interlayer insulating layer 170.

Figure 17:
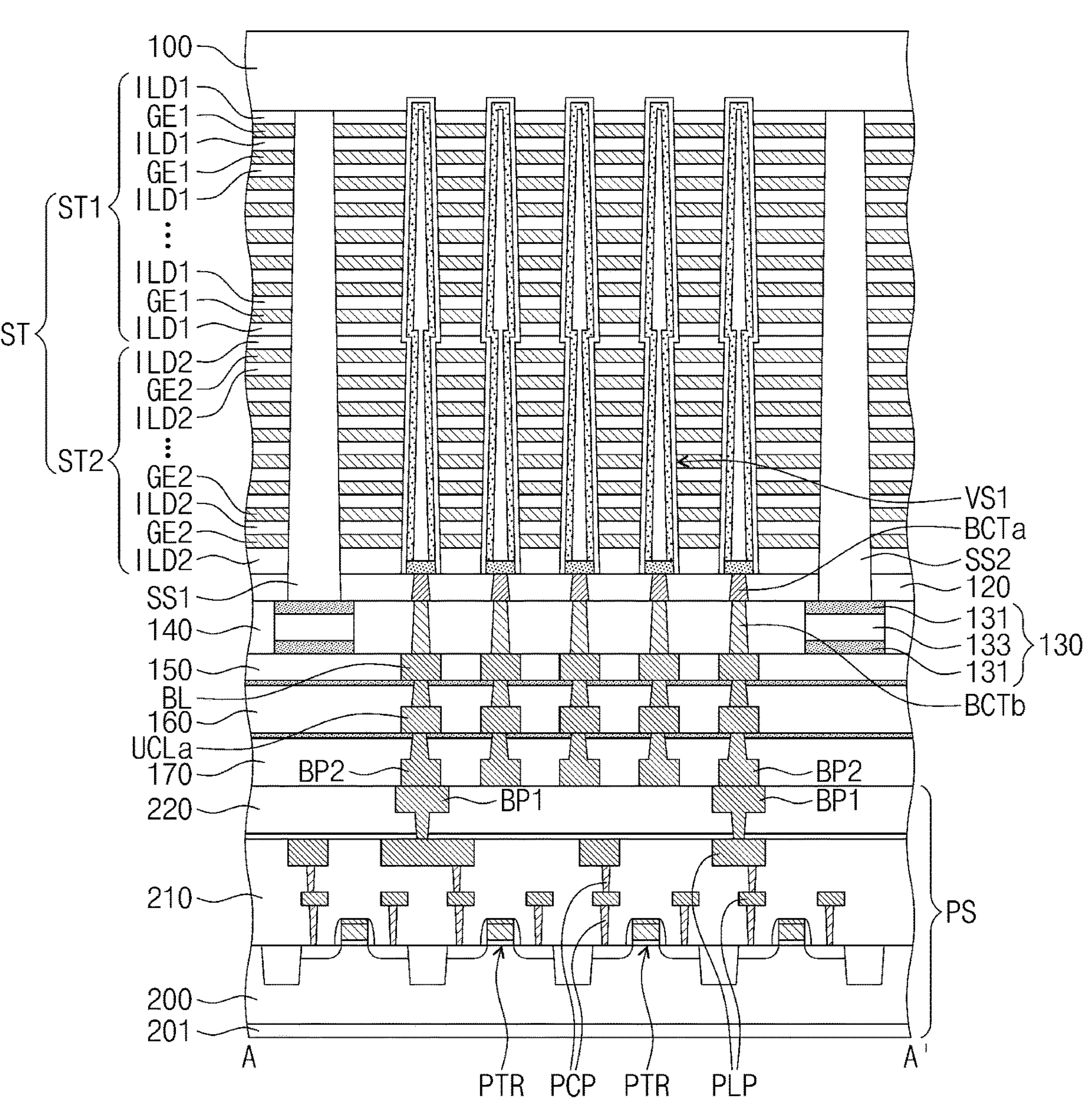

Referring to FIGS. 5 and 17, the peripheral circuit structure PS, which includes a second substrate 200 (e.g., the semiconductor substrate 200 of FIGS. 6A and 6B) and the peripheral circuits PTR formed thereon, may be prepared.

For example, the formation of the peripheral circuit structure PS may include forming a device isolation layer in the second substrate 200 to define an active region, forming the peripheral circuits PTR on the active region of the second substrate 200, and forming the peripheral contact plugs PCP, the peripheral circuit lines PLP, and the first bonding pads BP1, which are electrically connected to the peripheral circuits PTR, and a peripheral insulating layer 50 covering them.

The second substrate 200 may be formed of or may include silicon (Si), germanium (Ge), silicon germanium (SiGe), gallium arsenic (GaAs), indium gallium arsenic (InGaAs), and/or aluminum gallium arsenic (AlGaAs).

Row and column decoders, page buffers, and control circuits, which are used as the peripheral circuits PTR, may be formed on the second substrate 200. Here, the peripheral circuits PTR may include MOS transistors, in which the second substrate 200 is used as channel regions.

The peripheral insulating layers 210 and 220 may include a single insulating layer or a plurality of vertically-stacked insulating layers covering the peripheral circuits PTR. In an embodiment, the peripheral insulating layers 210 and 220 may include a plurality of lower insulating layers and etch stop layers between the lower insulating layers. In an embodiment, the peripheral insulating layers 210 and 220 may include a silicon oxide layer, a silicon nitride layer, a silicon oxynitride layer, and/or a low-k dielectric layer.

The peripheral contact plugs PCP may penetrate portions of the peripheral insulating layers 210 and 220 and may be connected to the peripheral circuits PTR. The peripheral circuit lines PLP may be formed by depositing and patterning a conductive layer.

The first bonding pads BP1 may be formed in the uppermost one of the peripheral insulating layers (i.e., the peripheral insulating layer 220). The first bonding pads BP1 may be electrically connected to the peripheral circuits PTR through the peripheral contact plugs PCP and the peripheral circuit lines PLP.

The first bonding pads BP1 may be formed using a damascene process. Top surfaces of the first bonding pads BP1 may be substantially coplanar with a top surface of a second lower insulating layer 55. In an embodiment, a planarization process may be performed to form the substantially coplanar surfaces. For example, the planarization process may be performed using a chemical mechanical polishing (CMP) process or an etch-back process.

Thereafter, the cell array structure CS, which is formed on the first substrate 100, may be bonded to the peripheral circuit structure PS, which is formed on the second substrate 200. Thus, the first bonding pads BP1 of the peripheral circuit structure PS may be bonded to the second bonding pads BP2 of the cell array structure CS, and the uppermost interlayer insulating layer 170 on the first substrate 100 may be bonded to the uppermost peripheral interlayer insulating layer 220 on the second substrate 200.

Since the first bonding pads BP1 are bonded to the second bonding pads BP2, the cell array structure CS may have a vertically inverted structure. For example, the first substrate 100 of the cell array structure CS may be placed at the highest position, and the staircase structure of the stack ST may have an inverted shape.

Figure 18:
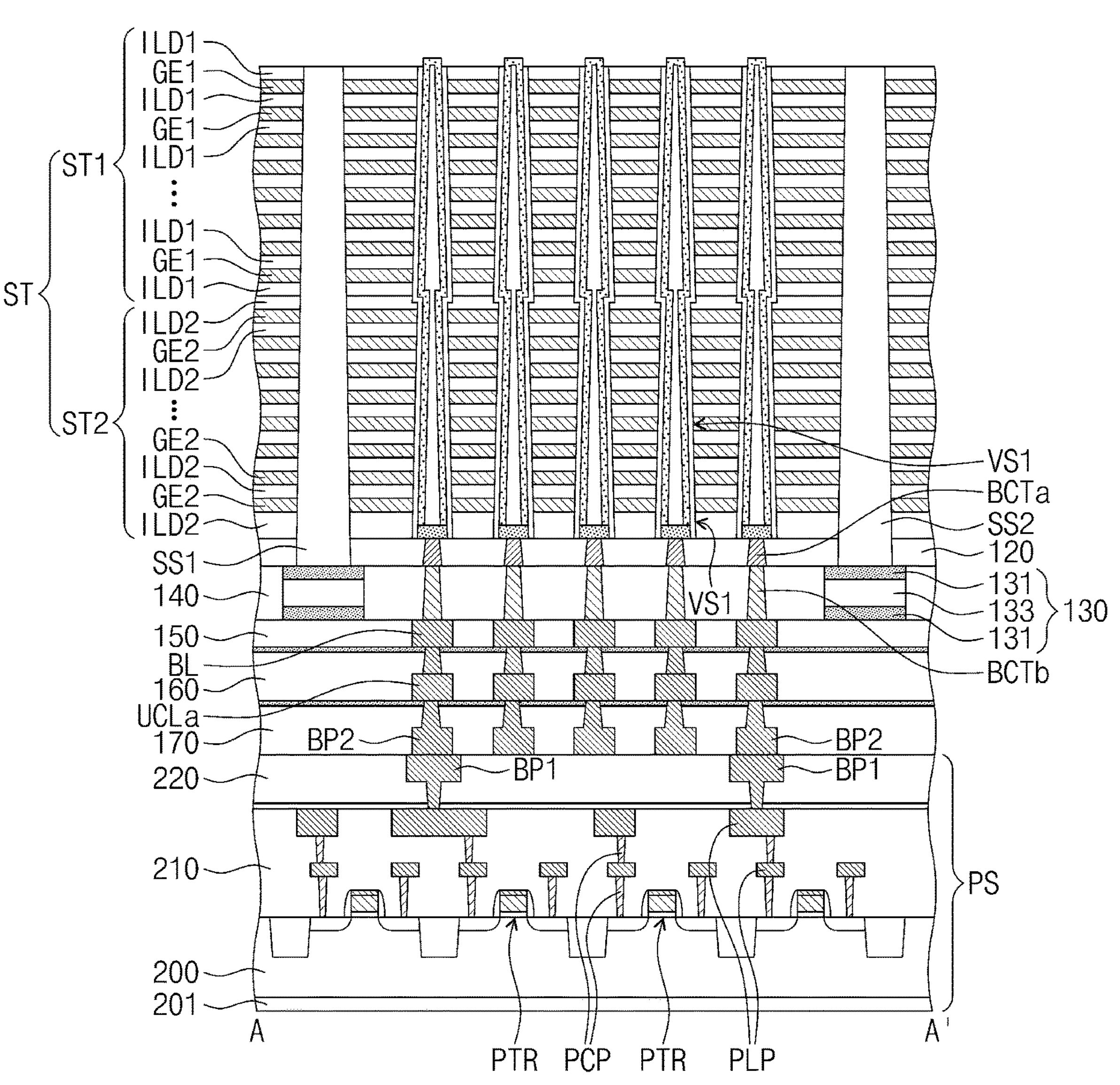

Referring to FIGS. 5 and 18, the first substrate 100 may be removed, after the bonding of the first and second bonding pads BP1 and BP2. The removing of the first substrate 100 may include a grinding process, a planarization process, a dry etching process, and a wet etching process. Since the first substrate 100 is removed, the top surface of the interlayer insulating layer ILD1 of the stack ST and the top surface of the first planarization insulating layer 110*a* (e.g., of FIG. 6B) may be exposed to the ambient environment. In addition, as a result of the removal of the first substrate 100, the data storage layer of the first vertical structures VS1 may include a protruding portion that is extended to a region higher than the lowermost interlayer insulating layer ILD1. Furthermore, the peripheral contact plugs PPLG (e.g., of FIG. 6B) and the input/output contact plug IOPLG (e.g., of FIG. 6B) may be exposed to the ambient environment.

The protruding portion of the data storage layer may be removed to expose top surfaces of the vertical channel layer. When the first substrate 100 is removed, the lowermost one of the interlayer insulating layers ILD1 may be used as an etch stop layer.

An isotropic etching process may be performed on the protruding portion of the data storage layer. Thus, an upper portion of the vertical channel layer may be exposed to the ambient environment, and the data storage pattern DSP (e.g., of FIG. 7) may have a pipe shape with opened top and bottom.

The isotropic etching process on the data storage layer may be performed using an etch recipe having an etch selectivity with respect to the vertical channel layer. The etching process on the data storage layer may include sequentially and isotropically etching the blocking insulating layer, the charge storing layer, and the tunnel insulating layer.

For example, the isotropic etching process may include sequentially performing a first etching process of etching a portion of the blocking insulating layer, a second etching process of etching a portion of the charge storing layer, and a third etching process of etching a portion of the tunnel insulating layer. Here, an etching solution containing hydrofluoric acid or sulfuric acid may be used in the first and third etching processes, and an etching solution containing phosphoric acid may be used in the second etching process. A profile of the top surface of the data storage pattern DSP may vary, depending on the etch recipes used in the first, second, and third etching processes.

Figure 19:
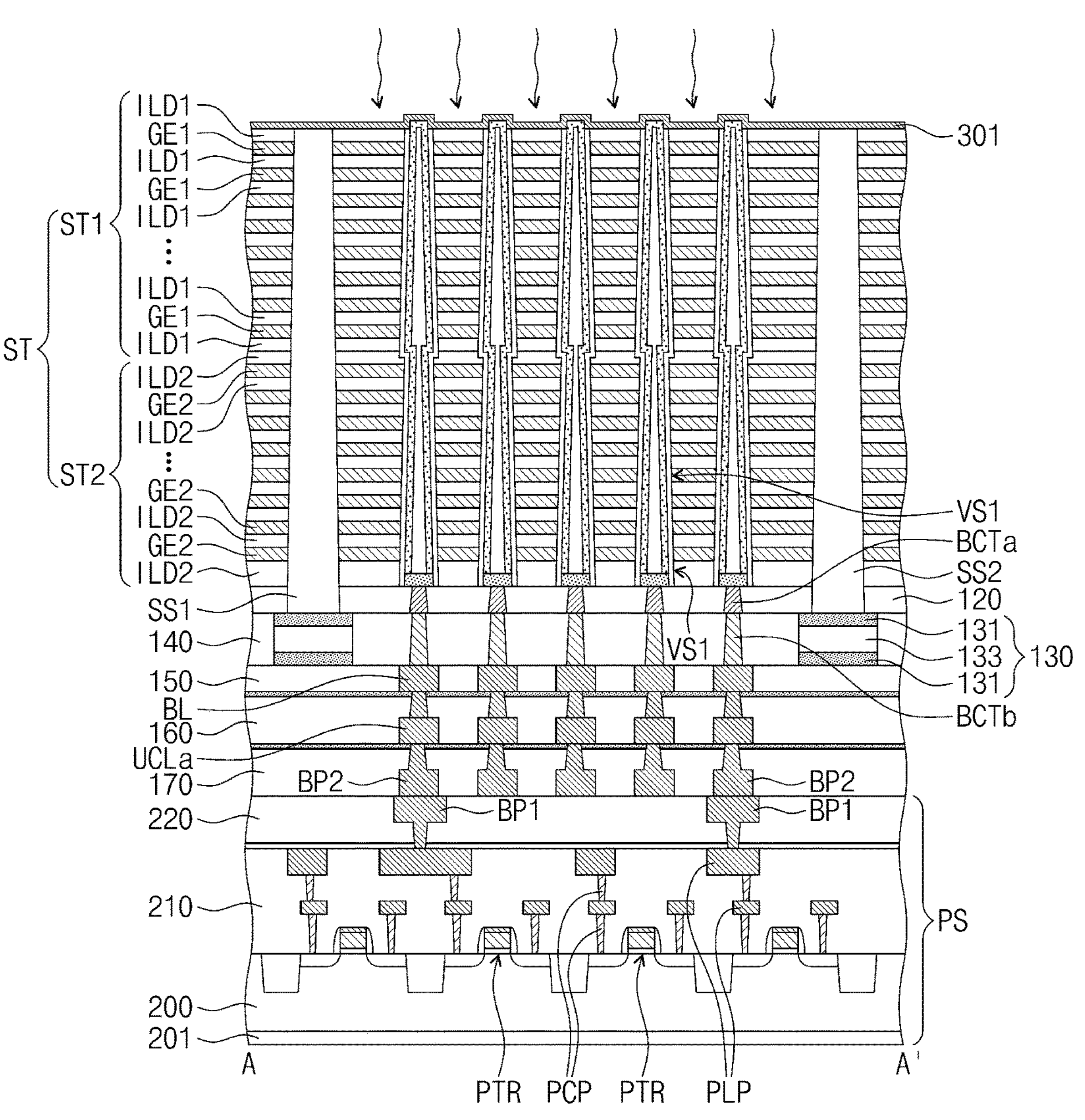

Referring to FIG. 19, the semiconductor layer 301, which is doped with impurities, may be deposited on the uppermost one of the interlayer insulating layers ILD1. During the deposition, the semiconductor layer 301 may be doped with impurities of a first conductivity type (e.g., n-type). In an embodiment, the semiconductor layer 301 may be formed by depositing an amorphous or poly silicon layer and performing a thermal treatment process (e.g., a laser annealing process) on the amorphous or poly silicon layer.

In an embodiment, a laser annealing process may be performed on the semiconductor layer 301 to reduce a grain boundary of the semiconductor layer 301. In addition, the reflection structures 130 may reflect a laser beam in the laser annealing process and may prevent the laser beam from being incident into the first and second bonding pads BP1 and BP2 and the peripheral circuit structure PS.

Figure 20:
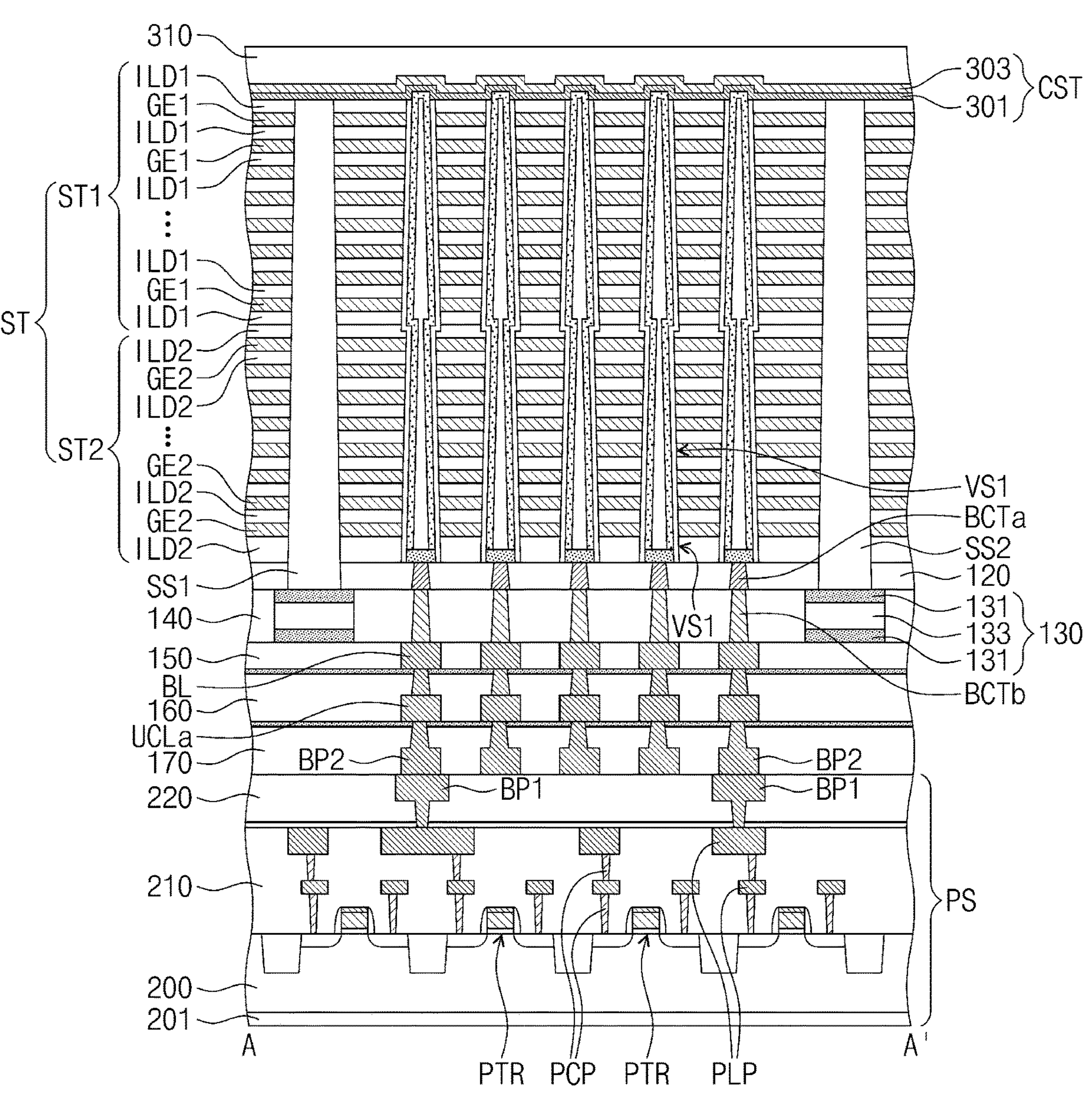

Referring to FIG. 20, the metal layer 303 may be formed on the semiconductor layer 301. The metal layer 303 may be formed using a deposition method (e.g., a chemical vapor deposition (CVD) method or an atomic layer deposition (ALD) method). The metal layer 303 may be formed of or may include metallic materials (e.g., tungsten, copper, and/or aluminum), conductive metal nitride materials (e.g., titanium nitride and tantalum nitride), or transition metals (e.g., titanium and tantalum). A metal silicide layer may be formed between the semiconductor layer 301 and the metal layer 303.

After the deposition of the semiconductor and metal layers 301 and 303, the semiconductor and metal layers 301 and 303 may be patterned to form the source conductive pattern CST in the cell array region CAR and the upper conductive patterns CP in the first and second connection regions CNR1 and CNR2. Thereafter, the upper insulating layer 310 may be formed on the source conductive pattern CST and the upper conductive patterns CP.

Referring back to FIGS. 5, 6A, and 6B, input/output pads PAD may be formed on the upper insulating layer 310. The input/output pad PAD may be connected to the input/output contact plug IOPLG through the upper via VA penetrating the upper insulating layer 310.

After the formation of the input/output pads PAD, the capping insulating layer 320, a protection layer 330, and the passivation layer 340 may be sequentially formed. The capping insulating layer 320 may include, for example, a silicon oxide layer, a silicon nitride layer, or a silicon oxynitride layer. The protection layer 330 may be, for example, a silicon nitride layer or a silicon oxynitride layer. The passivation layer 340 may be formed of or may include polyimide-based materials (e.g., photo sensitive polyimide (PSPI)). The passivation layer 340 may be formed on the protection layer 330 by a spin coating process.

Next, an opening OP exposing a portion of the input/output pad PAD may be formed by partially patterning the capping insulating layer 320, the protection layer 330, and the passivation layer 340.

According to an embodiment of the inventive concept, a semiconductor device may include a cell array structure and a peripheral circuit structure, which are bonded to each other. The semiconductor device may further include a reflection structure or an absorption pattern, which is overlapped with separation structures. Thus, it may be possible to prevent upper and lower interconnection lines, first and second bonding pads, and a peripheral circuit structure from being deteriorated by a laser beam in a laser annealing process, which is performed as a part of a semiconductor fabrication process.

While example embodiments of the inventive concept have been particularly shown and described, it will be understood by one of ordinary skill in the art that variations in form and detail may be made therein without departing from the spirit and scope of the present disclosure.

What is claimed is:

1. A semiconductor device, comprising:

a semiconductor substrate;

a peripheral circuit structure including peripheral circuits integrated on the semiconductor substrate and first bonding pads connected to the peripheral circuits; and a cell array structure including second bonding pads bonded to the first bonding pads, wherein the cell array structure comprises:

separation structures extending in a first direction;

a stack disposed between the separation structures, the stack comprising interlayer insulating layers and gate patterns, which are vertically and alternately stacked on top of one another;

a source conductive pattern disposed on the stack;

vertical structures penetrating the stack and electrically connected to the source conductive pattern; and reflection structures, which are vertically spaced apart from the source conductive pattern and are overlapped with the separation structures.

2. The semiconductor device of claim 1, wherein the reflection structures comprise first material patterns and second material patterns, which are alternately stacked, and wherein a refractive index of the first material patterns is different from a refractive index of the second material patterns.

3. The semiconductor device of claim 2, wherein each of the first material patterns has a first thickness, wherein each of the second material patterns has a second thickness that is larger than the first thickness, and wherein the refractive index of the first material patterns is higher than the refractive index of the second material patterns.

4. The semiconductor device of claim 2, wherein the first material patterns and the second material patterns include insulating materials.

5. The semiconductor device of claim 1, further comprising bit lines disposed between the second bonding pads and the stack, wherein the bit lines are extended in a second direction crossing the first direction and are connected to the vertical structures.

6. The semiconductor device of claim 5, wherein the reflection structure is disposed between the stack and the bit lines.

7. The semiconductor device of claim 1, wherein the source conductive pattern comprises a doped semiconductor layer, which is in contact with the vertical structures, and a metal layer, which covers the doped semiconductor layer.

8. The semiconductor device of claim 1, wherein each of the vertical structures comprises:

a vertical channel pattern in contact with the source conductive pattern;

a data storage pattern enclosing an outer side surface of the vertical channel pattern; and a vertical insulating pattern disposed in the vertical channel pattern.

9. The semiconductor device of claim 8, wherein a contact surface between the vertical channel pattern and the source conductive pattern is located at a level that is different from a contact surface between the source conductive pattern and the data storage pattern.

10. The semiconductor device of claim 1, further comprising:

an upper insulating layer covering the source conductive pattern;

an input/output contact plug laterally spaced apart from the stack and the source conductive pattern and coupled to one of the second bonding pads; and an input/output pad disposed on the upper insulating layer and connected to the input/output contact plug.

* * * * *